(12) United States Patent
Vierheilig et al.

(10) Patent No.: US 11,201,454 B2
(45) Date of Patent: Dec. 14, 2021

(54) SEMICONDUCTOR LASER

(71) Applicant: OSRAM Opto Semiconductors GmbH, Regensburg (DE)

(72) Inventors: Clemens Vierheilig, Tegernheim (DE); Alfred Lell, Maxhütte-Haidhof (DE); Sven Gerhard, Alteglofsheim (DE); Andreas Loeffler, Neutraubling (DE)

(73) Assignee: OSRAM OLED GMBH, Regensburg (DE)

( * ) Notice: Subject to any disclaimer, the term of this patent is extended or adjusted under 35 U.S.C. 154(b) by 184 days.

(21) Appl. No.: 16/091,172

(22) PCT Filed: Apr. 7, 2017

(86) PCT No.: PCT/EP2017/058378
§ 371 (c)(1),
(2) Date: Apr. 12, 2019

(87) PCT Pub. No.: WO2017/174782
PCT Pub. Date: Oct. 12, 2017

(65) Prior Publication Data
US 2019/0229497 A1    Jul. 25, 2019

(30) Foreign Application Priority Data

Apr. 8, 2016   (DE) .......................... 102016106495.5

(51) Int. Cl.
*H01S 5/20*    (2006.01)
*H01S 5/10*    (2021.01)
(Continued)

(52) U.S. Cl.
CPC .......... *H01S 5/2022* (2013.01); *H01S 5/1085* (2013.01); *H01S 5/22* (2013.01);
(Continued)

(58) Field of Classification Search
CPC ...... H01S 5/1085; H01S 5/22; H01S 5/34333; H01S 2301/17; H01S 5/0425; H01S 5/343; H01S 5/02; H01S 5/20
(Continued)

(56) References Cited

U.S. PATENT DOCUMENTS

| 6,236,793 B1 * | 5/2001 | Lawrence | ............... H01S 3/063 |
| | | | 385/132 |
| 7,772,606 B2 * | 8/2010 | Cao | ...................... H04N 9/3129 |
| | | | 257/98 |

(Continued)

FOREIGN PATENT DOCUMENTS

| CN | 103518298 A | 1/2014 |
| CN | 103701036 A | 4/2014 |

(Continued)

*Primary Examiner* — Tuan N Nguyen
(74) *Attorney, Agent, or Firm* — Slater Matsil, LLP

(57) ABSTRACT

The invention relates to a semiconductor laser comprising a layer structure comprising an active zone, wherein the active zone is configured to generate an electromagnetic radiation, wherein the layer structure comprises a sequence of layers, wherein two opposite end faces are provided in a Z-direction, wherein at least one end face is configured to at least partly couple out the electromagnetic radiation, and wherein the second end face is configured to at least partly reflect the electromagnetic radiation, wherein guide means are provided for forming an optical mode in a mode space between the end faces, wherein means are provided which hinder a formation of an optical mode outside the mode space, in particular modes comprising a propagation direction which do not extend perpendicularly to the end faces.

17 Claims, 14 Drawing Sheets

(51) Int. Cl.
  *H01S 5/22*   (2006.01)
  *H01S 5/02*   (2006.01)
  *H01S 5/042*  (2006.01)
  *H01S 5/343*  (2006.01)

(52) U.S. Cl.
  CPC .......... *H01S 5/34333* (2013.01); *H01S 5/021* (2013.01); *H01S 5/0218* (2013.01); *H01S 5/0421* (2013.01); *H01S 5/04252* (2019.08); *H01S 2301/166* (2013.01); *H01S 2301/17* (2013.01); *H01S 2304/12* (2013.01)

(58) Field of Classification Search
  USPC .................................................. 372/19, 45.01
  See application file for complete search history.

(56) References Cited

U.S. PATENT DOCUMENTS

| | | | |
|---|---|---|---|
| 8,264,765 B2* | 9/2012 | Vallius | H01S 5/141 359/326 |
| 8,306,084 B2 | 11/2012 | Reill et al. | |
| 8,340,146 B2 | 12/2012 | Lell et al. | |
| 8,369,370 B2* | 2/2013 | Lell | H01S 5/22 372/49.01 |
| 8,995,490 B2 | 3/2015 | Lell et al. | |
| 9,048,630 B2 | 6/2015 | Sojetz et al. | |
| 9,048,631 B2 | 6/2015 | Eichler et al. | |
| 9,214,785 B2* | 12/2015 | Eichler | H01S 5/1017 |
| 2003/0058910 A1 | 3/2003 | Gruber et al. | |
| 2006/0193353 A1 | 8/2006 | Kim et al. | |
| 2008/0089374 A1 | 4/2008 | Eichler et al. | |
| 2008/0192781 A1* | 8/2008 | O'Gorman | H01S 5/2231 372/20 |
| 2009/0129421 A1* | 5/2009 | Kitatani | H01S 5/22 372/50.23 |
| 2014/0133504 A1* | 5/2014 | Stojetz | H01S 5/22 372/44.01 |
| 2014/0268309 A1* | 9/2014 | Strohkendl | G02B 6/10 359/341.1 |
| 2015/0085889 A1* | 3/2015 | Eichler | H01S 5/0264 372/45.01 |
| 2015/0303654 A1* | 10/2015 | Petrescu-Prahova | H01S 5/2031 372/45.01 |
| 2016/0164257 A1* | 6/2016 | Adachi | H01S 5/1231 385/14 |

FOREIGN PATENT DOCUMENTS

| | | |
|---|---|---|
| DE | 19963807 A1 | 7/2001 |
| DE | 102006046297 A1 | 4/2008 |
| DE | 102007060204 A1 | 4/2009 |
| DE | 102008013896 A1 | 6/2009 |
| DE | 102008012859 A1 | 11/2009 |
| DE | 102010046793 A1 | 3/2012 |
| DE | 102011100175 A1 | 11/2012 |
| DE | 102012103549 A1 | 10/2013 |
| DE | 102012109175 A1 | 4/2014 |
| EP | 1906498 A1 | 4/2008 |
| WO | 2009039811 A2 | 4/2009 |

* cited by examiner

SEMICONDUCTOR LASER

This patent application is a national phase filing under section 371 of PCT/EP2017/058378, filed Apr. 7, 2017, which claims the priority of German patent application 10 2016 106 495.5, filed Apr. 8, 2016, each of which is incorporated herein by reference in its entirety.

TECHNICAL FIELD

The invention relates to a semiconductor laser according to patent claim 1, and to a method for producing a semiconductor laser according to patent claim 32.

BACKGROUND

In the prior art it is known to produce semiconductor lasers, wherein the semiconductor lasers comprise mode guiding between two end faces. The mode guiding may be formed in an index-guided fashion via a ridge structure or in a gain-guided fashion, e.g., as an oxide stripe laser.

The semiconductor lasers are formed, for example, as edge emitting semiconductor lasers, wherein the semiconductor laser comprises a layer sequence comprising a first cladding layer, a first waveguide (p-doped), an active zone, a second waveguide and a second cladding layer (n-doped).

SUMMARY OF THE INVENTION

Embodiments provide an improved semiconductor laser, wherein in particular a formation of a mode outside the mode space is hindered.

In at least one embodiment a semiconductor laser comprising a layer structure comprising an active zone is proposed, wherein the active zone is configured to generate an electromagnetic radiation, wherein the layer structure comprises a sequence of layers, wherein at least one end face is configured to at least partly couple out the electromagnetic radiation, wherein guide means are provided for forming an optical mode in a mode space, wherein means are provided outside the mode space which hinder, in particular prevent, a formation of an optical mode outside the mode space, in particular modes comprising a propagation direction which do not extend perpendicularly to the end faces.

As a result, in particular in the case of high-power semiconductor lasers that are used, for example, for projection applications or for laser headlights/spotlights, the excitation of an oscillation mode outside the mode space is hindered or prevented. A concentration of the optical power in the mode space is thus achieved.

Moreover, by providing the means for suppressing undesired modes, it is possible to use wider resonator structures and layer structures comprising lower losses, in particular epitaxial layers, transversely or obliquely with respect to the propagation direction of the traveling laser modes, without an undesired laser mode being established. The formation of a resonator, in particular of a ring resonator, may be prevented by the means for suppressing the modes.

In one embodiment, the sequence of layers is implemented along a Y-direction, wherein the active zone is arranged in an X-Z-plane. The layer structure comprises at least one first side face, wherein the first side face extends along the Z-direction. The first side face as viewed in X-Z-plane is arranged in a manner inclined at an angle with respect to the Z-direction. The formation of an optical mode outside the mode space is hindered by the inclined arrangement of the first side face. In one embodiment, the first side face as viewed in the Y-X-plane is arranged parallel to the Y-direction.

In a further embodiment, the first side face as viewed in the Y-X-plane is arranged in a manner inclined at an angle with respect to the Y-direction. The formation of an optical mode outside the mode space is further hindered by the inclined arrangement of the first side face.

In one embodiment, the layer structure comprises at least one second side face, wherein the second side face extends along the Z-direction. The second side face as viewed in the X-Z-plane is arranged in a manner inclined at an angle with respect to the Z-direction. The second side face is arranged opposite the first side face. The formation of an optical mode outside the mode space is additionally hindered by the inclined arrangement of the second side face.

In one embodiment, at least one partial region of the first side face and/or of the second side face is formed as antireflective. The antireflective partial region may be configured to transmit more than 50%, in particular more than 80%, of the electromagnetic radiation emitted by the active zone. As a result, an undesired back-reflection into the mode space is reduced, in particular prevented.

In one embodiment, the layer structure comprises at least one first side face, wherein the first side face extends along the Z-direction, wherein deflection means are provided at at least one partial region of the first side face, wherein the deflection means are configured to bring about a reflection of an electromagnetic radiation that emanates from the mode space and impinges on the first side face in a direction alongside the mode space. The side face is appropriate for forming a deflection means on the semiconductor laser using simple means. The side face is easily accessible far enough away from the mode space to bring about a deflection of incident electromagnetic radiation laterally alongside the mode space.

In one embodiment, the first side face is arranged in a manner inclined at an angle with respect to a plane of the active zone, such that an electromagnetic radiation that emanates from the mode space and impinges on the first side face is deflected substantially into a region above or below the mode space, wherein the angle lies in particular in a range of between 1° and 89°, preferably between 45° and 65°, relative to the plane of the active zone. The inclined arrangement of the side face is an efficient means for reducing and in particular avoiding the formation of a loss mode traveling transversely with respect to the laser mode or a negative influencing of the mode in the mode space. Moreover, the inclined side face may be produced using simple means.

In one configuration, the first side face extends along the Y-direction right into a plane of a first waveguide layer, in particular right into a positively doped waveguide layer. In a further embodiment, the first side face may extend right into a plane of the active zone. The further the first side face extends in the Y-direction of the layer structure, the more efficient the deflection of the electromagnetic radiation by the inclined side face.

In one configuration, the first side face extends along the Y-direction right into a plane of a second waveguide layer, wherein the second waveguide layer as viewed in the Y-direction is arranged below the plane of the active zone.

In one embodiment, the first side face is formed by a side face of a first recess formed in the layer structure. As a result, the side face may be configured for deflecting the electromagnetic radiation in a desired region of the semiconductor laser, wherein the position, the form and the extent of the side face are independent of the form of the semiconductor laser. It is thus possible to carry out an optimum adaptation of the side face to the form and the construction of the laser diode with the desired deflection of the electromagnetic radiation.

In one embodiment, the means is provided as damping means outside the mode space, wherein the damping means are configured to damp an electromagnetic radiation, in particular to suppress the formation of a laser mode. In contrast to the suitable deflection, with the damping of the electromagnetic radiation a further efficient means is chosen for reducing the negative influencing of the mode by secondary modes and/or for hindering or preventing the formation of secondary modes. By virtue of the damping means, energy is drawn from the electromagnetic radiation outside the mode space. The oscillation build-up of a secondary mode is thus hindered.

In one configuration, a damping means in the form of an absorbing layer is applied at least on a partial region of the first side face, wherein the absorbing layer is configured to damp, in particular to suppress, a reflection of an incident electromagnetic radiation. With the aid of the absorbing layer, a suitable damping of the electromagnetic radiation outside the mode space may be achieved independently of the construction of the layer structure of the semiconductor laser.

In one configuration, the layer structure comprises a trench, wherein the trench comprises a predefined depth in a Y-direction, a predefined width in an X-direction and a predefined length in the Z-direction, wherein the trench extends at least over part of the length of the semiconductor laser in the Z-direction, wherein the trench is at least partly provided with a damping layer, wherein the damping layer is configured to at least partly absorb electromagnetic radiation. With the aid of this embodiment, the absorbing layer may be formed at a desired position with a desired area and thickness independently of the form of the semiconductor laser.

In one embodiment, the absorbing layer comprises a metal, in particular Cr, Ti, Pd, Pt, Rh, Ni, Al, Au or combinations thereof. Metals are suitable for the desired damping and may be applied using simple means. The metals may be formed in the form of a plurality of layers comprising different metals or alloys in the form of a layer comprising an alloy comprising different metals.

In one embodiment, the absorbing layer comprises a semiconductor material, in particular Si or Ge. The semiconductor materials may be applied on the layer structure using simple means, without significantly influencing the optical and/or the electrical properties of the semiconductor laser. Moreover, the semiconductor materials enable a sufficient damping of the electromagnetic radiation.

In one embodiment, the absorbing layer comprises a compound semiconductor, in particular GaAs, AlGaAs, GaP, AlN, SiC, GaN, GaInN or combinations thereof. The compound semiconductors may be applied on the layer structure of the semiconductor laser using simple means, without significantly influencing the optical and/or the electrical properties of the semiconductor laser. Moreover, the compound semiconductor materials enable a sufficient damping of the electromagnetic radiation.

In one embodiment, the absorbing layer comprises a dielectric material, in particular $SiO_2$, SiON, $Si_3N_4$, $Al_2O_3$, $HfO_2$, $TiO_2$, $Ta_2O_5$, $ZrO_2$. The dielectric materials may be applied on the layer structure of the semiconductor laser using simple means, without significantly influencing the optical and/or the electrical properties of the semiconductor laser. Moreover, the dielectric materials enable a sufficient damping of the electromagnetic radiation.

In one embodiment, the dielectric material comprises impurity atoms and/or an increased proportion of non-saturated bonds on account of stoichiometrically absent atoms, in particular Si, Al, Hf, Ti, Ta, or Zr atoms not saturated with an oxygen or nitrogen compound, or a hydrogen proportion lying above a stoichiometric ratio. An increased damping of the electromagnetic radiation may be achieved as a result.

In a further embodiment, the damping layer comprises hydrocarbons, in particular aromatics or parylenes. With these materials, too, it is possible to achieve a desired damping of the electromagnetic radiation outside the mode space.

In a further embodiment, the absorbing layer comprises silicates. With silicates, too, it is possible to achieve a desired damping of the electromagnetic radiation outside the mode space.

In one embodiment, in the case of formation of an electrically conductive absorbing layer, an electrical barrier layer, in particular a blocking or an electrically insulating layer, is formed between the absorbing layer and at least one layer of the layer structure in order to reduce or to prevent an undesired current flow between two layers of the layer structure. Consequently, even electrically conductive absorbing layers may be used, without negatively influencing the electrical properties of the semiconductor laser.

In one embodiment, the damping means is formed in the form of a damping partial region of the layer structure, wherein the partial region of the layer structure is configured to at least partly absorb the electromagnetic radiation. Consequently, the layer structure itself may be used to achieve a damping of the electromagnetic radiation outside the mode space.

In one embodiment, at least one partial region of the first side face comprises a mechanical structure that reduces, in particular prevents, directional reflection or a propagation of an electromagnetic radiation, wherein the mechanical structure is formed in particular in the form of a roughness, in the form of steps and/or in the form of dislocations. Consequently, a simple means may be provided which suppresses the formation of a secondary mode outside the mode space.

In one configuration, the damping means is formed at least as a partial region of at least one layer of the layer structure, wherein the partial region of the layer is formed vis-à-vis another region of the layer in such a way that the partial region absorbs or scatters electromagnetic radiation better than the other region of the layer. Consequently, a suppression of a secondary mode may be achieved already in the region of the layer structure.

In one embodiment, a layer of the layer structure is formed as absorbing layer. The layer is arranged outside the active zones. In particular, the absorbing layer may be arranged on an n-side of the layer structure.

In one embodiment, at least the partial region comprises a band gap which is smaller than energy of the electromagnetic radiation of the semiconductor laser, such that the electromagnetic radiation is absorbed. To that end, the partial region may comprise impurity atoms or dopants, in particular a different composition, in particular an increased concentration of indium, in order to absorb the electromagnetic radiation better than other regions of the layer. The difference in the composition may comprise greater than 1% or greater than 5% or more. Moreover, the transition in the composition may be carried out in one step or in a plurality of steps or gradually.

In one embodiment, at least the layer comprises quantum films, wherein the quantum films comprise a smaller band gap, in the partial region than in the other region, wherein the smaller band gap is produced by a larger thickness of the quantum film and/or by a different composition, such that the electromagnetic radiation is absorbed better than in the other region of the layer.

In one embodiment, a carrier is provided, wherein the semiconductor laser is arranged on the carrier, and wherein the damping means is arranged at least in a partial region of the carrier. Consequently, a suppression of a secondary mode may be achieved with the aid of a carrier as well.

In a further embodiment, the carrier is configured to absorb the electromagnetic radiation.

The embodiments described may lead to an improvement in the semiconductor laser individually by themselves or in different combinations.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, wherein.

DETAILED DESCRIPTION OF ILLUSTRATIVE EMBODIMENTS

A semiconductor laser comprises a layer structure comprising an active zone. The active zone is configured to generate an electromagnetic radiation. The layer structure comprises a sequence of layers, wherein two opposite end faces are provided in a Z-direction. At least one end face is configured to at least partly couple out the electromagnetic radiation of the active zone. The second end face is configured to at least partly reflect the electromagnetic radiation. Between the end faces, guide means are provided for forming an optical mode in a mode space between the end faces. Index guiding via a bridge structure or gain guiding by restricting the current-carrying layers, e.g., in the form of an oxide stripe laser may be provided as guide means for the mode. Examples of semiconductor lasers comprising a ridge structure and index guiding are described below. However, embodiments of the invention may likewise be used in the case of gain-guided semiconductor lasers.

Figure 1:
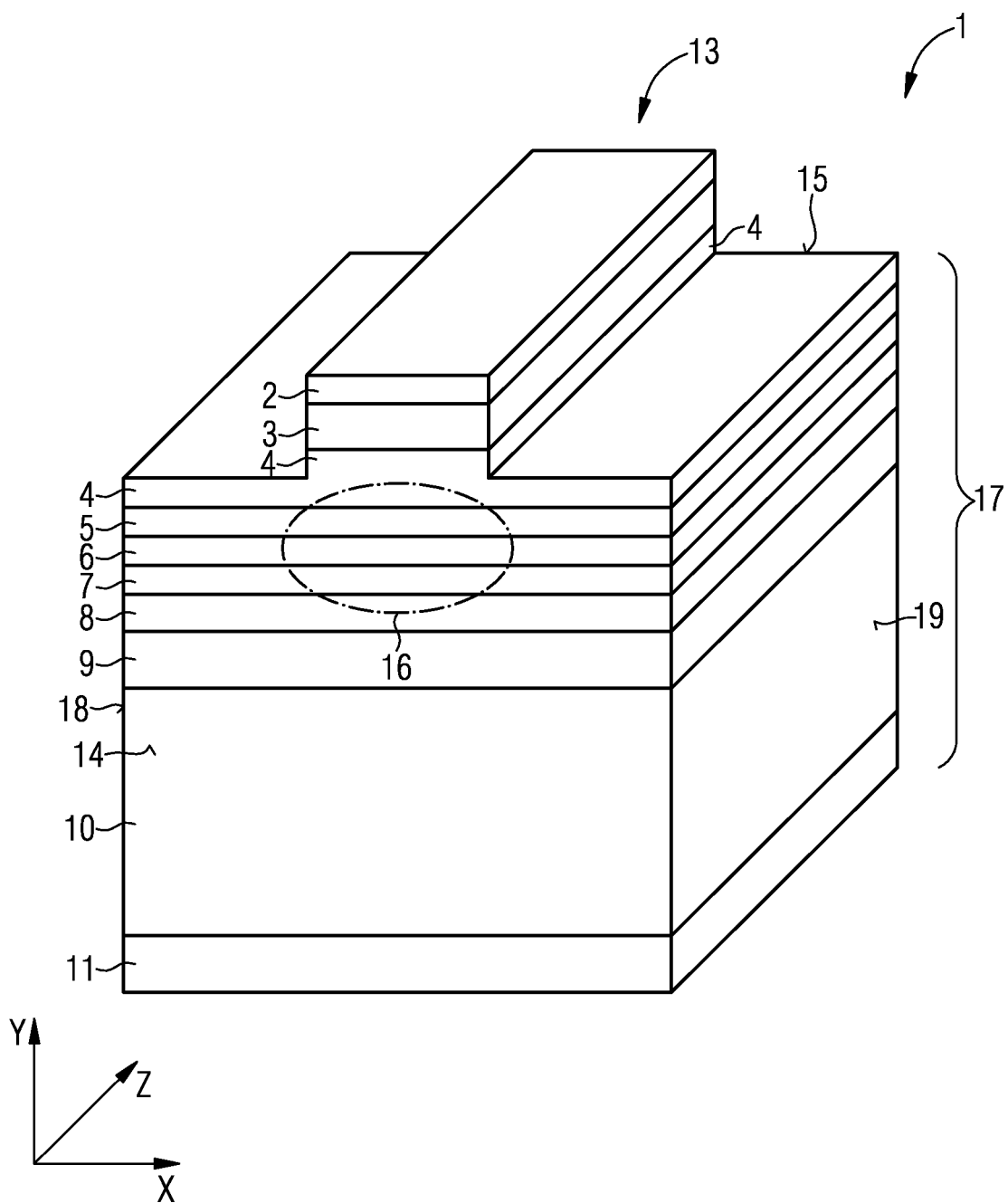
FIG. 1 illustrates a semiconductor laser in a schematic perspective illustration.

FIG. 1 illustrates a coordinate system comprising an X-, Y- and Z-axis, wherein the axes are in each case perpendicular to one another. A semiconductor laser 1 is illustrated in a schematic, perspective illustration, wherein the semiconductor laser 1 comprises a main body 17 and a ridge 13. The semiconductor laser 1 is constructed in the form of semiconductor layers arranged in the Z-X-plane, wherein the semiconductor layers are arranged one above another along the Y-axis. The semiconductor laser 1 comprises a first contact layer 2, which is arranged on a first semiconductor layer 3. The first semiconductor layer 3 is arranged on a first cladding layer 4. In the embodiment illustrated, the ridge 13 transitions with the first cladding layer 4 into the wider main body 17. The first cladding layer 4 at least down to a defined depth, i.e., in the Y-direction, comprises a narrower width in the X-direction than the main body 17. Index guiding of the laser mode is achieved as a result. In the case of a gain-guided embodiment of the semiconductor laser, no ridge 13 would be present; rather the first semiconductor layer 3 and the first cladding layer 4 would comprise the same width in the X-direction as the main body. However, in the case of this embodiment, the width of the first contact layer 2 would be significantly narrower in order to limit the current-carrying width.

The first cladding layer 4 is arranged on a first waveguide layer 5. The first waveguide layer 5 is arranged on an active zone 6. The active zone 6 is arranged on a second waveguide layer 7. The second waveguide layer 7 is arranged on a second cladding layer 8. The second cladding layer 8 is arranged on a second semiconductor layer 9. The second semiconductor layer 9 is arranged on the substrate 10. The substrate 10 is arranged on a second contact layer 11. Depending on the embodiment chosen, the ridge 13 may comprise only the first semiconductor layer 3. Moreover, the ridge 13 may comprise the layers as far as the active zone 6 or even the active zone 6 as well. At opposite side faces, the main body 17 of the semiconductor laser 1 comprises a first and a second side face 18, 19.

The first and second contact layers 2, 11 comprise a metal layer sequence, for example. The metal layer sequence can be formed from gold, platinum, titanium, nickel, palladium and rhodium. Alternatively, the first and second contact layers 2, 11 may also be formed from electrically conductive oxides such as, e.g., indium tin oxide. The first semiconductor layer 3, the first cladding layer 4 and the first waveguide layer 5 are formed in the form of semiconductor layer, wherein the semiconductor layers are positively doped and thus constitute a p-side of the layer arrangement of the semiconductor laser. The active zone 6 comprises a layer sequence of one or more quantum wells.

The second waveguide layer 7, the second cladding layer 8 and the second semiconductor layer 9 are likewise formed from a semiconductor material, which is negatively doped. Consequently, the second waveguide layer 7, the second cladding layer 8 and the second semiconductor layer 9 constitute an n-side of the layer structure of the semiconductor laser. Moreover, blocking layers, intermediate layers and growth layers (not illustrated) may be provided.

The substrate and/or the semiconductor layer sequence may be based on a III-V compound semiconductor or a II-VI compound semiconductor. The II-VI compound semiconductor may be a sulfide or a selenide. The III-V compound semiconductor may be based on a nitride compound semiconductor, a phosphide compound semiconductor, an antimonide compound semiconductor or an arsenide compound semiconductor. The III-V compound semiconductor may be, for example, a nitride such as, for instance, GaN, InN or AlN, a phosphide such as, for instance, GaP or InP, or an arsenide, such as, for instance, GaAs or InAs. In the present context, based on nitride compound semiconductors means that the substrate and/or the semiconductor layer sequence or at least one layer thereof comprise(s) a nitride III compound semiconductor material, preferably $Al_nGa_mIn_{1-n-m}N$. In this case, this material need not necessarily comprise a mathematically exact composition according to the above formula. Rather, it may comprise one or more dopants and additional constituents that substantially do not change the characteristic physical properties of the $Al_nGa_mIn_{1-n-m}N$ material. For the sake of simplicity, however, the above formula includes only the essential constituents of the crystal lattice Al, Ga, In, N, even if these may be replaced in part by small amounts of further substances. In the present context, based on phosphide compound semiconductors means that the substrate and/or the semiconductor layer sequence or at least one layer thereof comprise(s) preferably $Al_nGa_mIn_{1-n-m}P$. In this case, this material need not necessarily comprise a mathematically exact composition according to the above formula. Rather, it may comprise one or more dopants and additional constituents that substantially do not change the physical properties of the material. For the sake of simplicity, however, the above formula includes only the essential constituents of the crystal lattice Al, Ga, In, P, even if these may be replaced in part by small amounts of further substances. In the present context, based on antimonide compound semiconductors means that the substrate and/or the semiconductor layer sequence or at least one layer thereof comprise(s) preferably $Al_nGa_mIn_{1-n-m}Sb$. In this case, this material need not necessarily comprise a mathematically exact composition according to the above formula. Rather, it may comprise one or more dopants and additional constituents that substantially do not change the physical properties of the material. For the sake of simplicity, however, the above formula includes only the essential constituents of the crystal lattice Al, Ga, In, Sb, even if these may be replaced in part by small amounts of further substances. In the present context, based on arsenide compound semiconductors means that the substrate and/or the semiconductor layer sequence or at least one layer thereof comprise(s) preferably $Al_nGa_mIn_{1-n-m}As$. In this case, this material need not necessarily comprise a mathematically exact composition according to the above formula. Rather, it may comprise one or more dopants and additional constituents that substantially do not change the physical properties of the material. For the sake of simplicity, however, the above formula includes only the essential constituents of the crystal lattice Al, Ga, In, As, even if these may be replaced in part by small amounts of further substances. In this context, based on II-VI compound semiconductors means that the substrate and/or the semiconductor layer sequence or at least one layer thereof preferably comprises $Zn_nCd_{1-n}S_mSe_{1-m}$. In this case, this material need not necessarily comprise a mathematically exact composition according to the above formula. Rather, it may comprise one or more dopants and additional constituents that substantially do not change the physical properties of the material. For the sake of simplicity, however, the above formula only includes the essential constitutes of the crystal lattice Zn, Cd, S, Se, even if these may be replaced in part by small amounts of further substances.

Examples of nitride-based semiconductor layer structures are described below. The first semiconductor layer 3 comprises or consists of gallium nitride, for example, the first cladding layer 4 aluminum gallium nitride, and the first waveguide layer 5 gallium nitride or indium gallium nitride. The quantum wells of the active zone 6 comprise indium gallium nitride, for example, wherein the quantum wells are separate from one another by gallium nitride layers. The second waveguide layer 7 comprises or consists of gallium nitride or indium gallium nitride, for example, the second cladding layer 8 aluminum gallium nitride, the second semiconductor layer 9 aluminum gallium nitride. Moreover, in the active zone an electron barrier may be provided on the p-side, which consists, e.g., of aluminum gallium nitride.

The first cladding layer 4 and the second cladding layer 8 each comprise a lower refractive index than the adjoining first waveguide layer 5 and the adjoining second waveguide layer 7, respectively. In this way, waveguiding of the electromagnetic radiation generated by the active zone 6 may be carried out by the first and second waveguide layer 5, 7.

The semiconductor layers of the p-side are positively doped, for example, by addition of magnesium. Depending on the embodiment chosen, the second semiconductor layer 9 may be dispensed with. The semiconductor layers of the n-side of the semiconductor laser are negatively doped, for example, by addition of silicon. The substrate 10 is likewise negatively doped in order to produce an electrically conductive connection to the second contact 11.

Mode guiding along a longitudinal axis, that is to say in the Z-direction, may be carried out by virtue of the fact that, as in the example illustrated, a ridge 13 is formed which limits a width of the current supply of the active zone 6, that is to say in the X-direction, and causes a refractive index jump. Instead of the configuration of the ridge structure, it is possible to achieve the limited current-carrying through the active zone by the configuration of a narrow contact strip along the Z-axis on the first semiconductor layer 3. For confinement, an oxide layer may be formed between the p-contact and the first semiconductor layer 3.

A first and a second end face 14, 15 of the semiconductor laser 1, which are formed at opposite ends of the semiconductor laser 1 in the Z-direction, may comprise a mirror layer, in particular be formed in such a way that at least one predefined part of the electromagnetic radiation is reflected at the end faces. Moreover, one of the end faces 14, 15 is formed in such a way that a part of the electromagnetic radiation is emitted via the end faces.

Moreover, the semiconductor laser 1 comprises a mode space 16 formed between the first and second end faces 14, 15 in the region of the active zone and in the region of the first and second waveguide layer 5, 7. The mode space 16 denotes the region of the semiconductor laser 1 in which a large portion of the intensity of the electromagnetic radiation is formed and a laser mode forms. The mode space 16 is defined, for example, by that region in the semiconductor layer structure in which the electromagnetic radiation generated by the active zone 6 comprises at least 50% of the maximum intensity. For the lowest possible power loss, it is advantageous if the electromagnetic radiation is concentrated in a narrowly delimited mode space 16. In the Y-direction, this is achieved by the guiding with the aid of the waveguides. Moreover, the first and second end faces 14, 15 are arranged as far as possible parallel to one another in order to enable an effective reflection into the mode space.

In the following figures, a description is given of embodiments of semiconductor lasers in which a coupling out of electromagnetic radiation from the mode space 16 is hindered, in particular the formation of secondary modes laterally with respect to the mode space 16, in particular the formation of a resonator, for example, in the form of a ring resonator, is hindered.

The layer construction of the semiconductor laser in FIG. 1 is merely by way of example. Other semiconductor materials, other layer sequences, etc., may be used to form a semiconductor laser 1 in accordance with FIG. 1.

Figure 2:
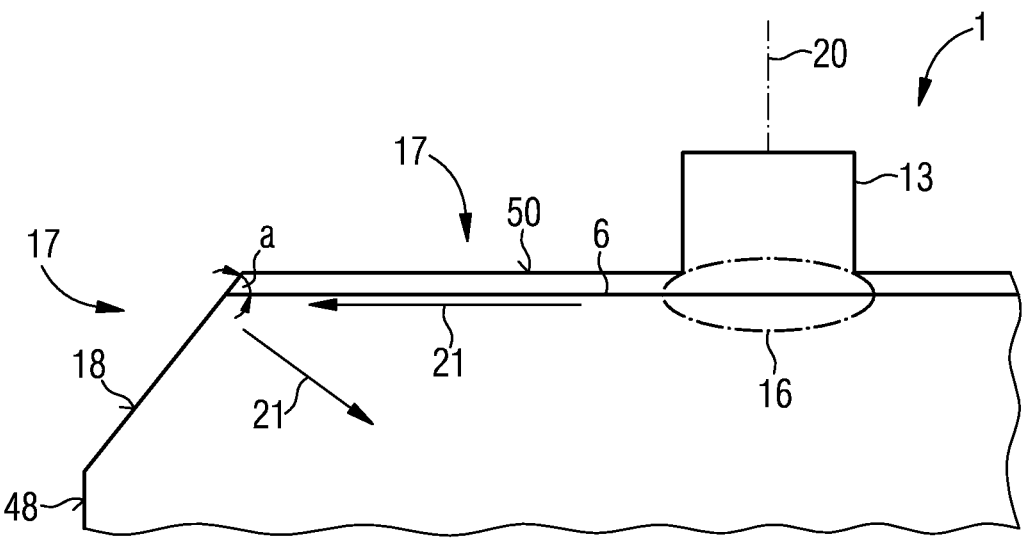
FIG. 2 illustrates a partial cross section through a first exemplary embodiment of a semiconductor laser comprising a side face arranged in an inclined manner.
Figure 2:
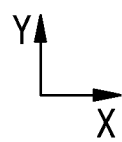

FIG. 2 shows, in a schematic illustration, a partial cross section through one embodiment of a semiconductor laser, wherein only a left-hand side of the semiconductor laser comprising a first side face 18 is illustrated in the embodiment illustrated. The opposite second side face (not illustrated) of the semiconductor laser 1 may be formed mirror-symmetrically with respect to a center plane 20. The ridge 13 need not be formed in the center plane 20 or symmetrically with respect to the center plane 20. Moreover, in some instances only parts of the structures are illustrated in this figure and in subsequent figures. In particular, the substrate and/or the electrical contact layers are/is not always illustrated.

In the embodiment illustrated, the first side face 18 is arranged in a manner inclined at an angle a of between 1 and 89° in relation to a Z-X-plane of the active zone 6, wherein a width of the main body 17 in the X-direction decreases in the direction of the top side 50 of the main body 17. Consequently, an electromagnetic radiation 21 radiated laterally from the mode space 16 in the direction of the first side face 18 is deflected downward in the direction of a substrate. The electromagnetic radiation 21 is thus not directed back into the mode space 16 or to the opposite second side face. As a result, the formation of a secondary mode, for example, of a ring resonator, is hindered or suppressed. The first side face 18 transitions into a first sidewall 48 in a region below the second cladding surface, said first sidewall being arranged perpendicularly to the plane of the active zone.

Depending on the embodiment chosen, the second side face 19 is formed mirror-symmetrically with respect to the first side face 18. The second side face 19 may likewise transition into a second sidewall 49 arranged perpendicularly to the plane of the active zone. Consequently, an electromagnetic radiation 21 radiated onto the second side face 19 is likewise deflected downward away from the mode space 16. Depending on the embodiment chosen, it is also possible for only one of the two side faces 18, 19 to be arranged in a manner inclined at an angle with respect to the plane of the active zone 6. Depending on the embodiment chosen, at least only one partial section of the first and/or of the second side face 18, 19 along the Z-direction is arranged in a manner inclined at the angle of between 1 and 89° with respect to the plane of the active zone 6. Depending on the embodiment chosen, the first and/or the second side face 18, 19 may be arranged in an inclined manner along the entire length, that is to say in the Z-direction, of the semiconductor laser 1. Moreover, the first and/or the second side face 18, 19 may comprise different inclination angles in relation to the plane of the active zone along the length of the semiconductor laser 1. Furthermore, partial sections of the first and/or of the second side face 18, 19 may comprise different inclination angles a with respect to the plane of the active zone 6.

The further the first or the second side face 18, 19 extends in the direction of the Y-axis, the better the suppression of secondary modes. Starting from the plane of the second cladding surface, however, a further lengthening of the first and/or of the second side face 18, 19 no longer exhibits significant improvement.

Experiments have shown that an arrangement of the first and/or of the second side face 18, 19 in an angular range of between 45° and 65° in relation to the plane of the active zone offers good results for suppressing the formation of a secondary mode.

Figure 3:
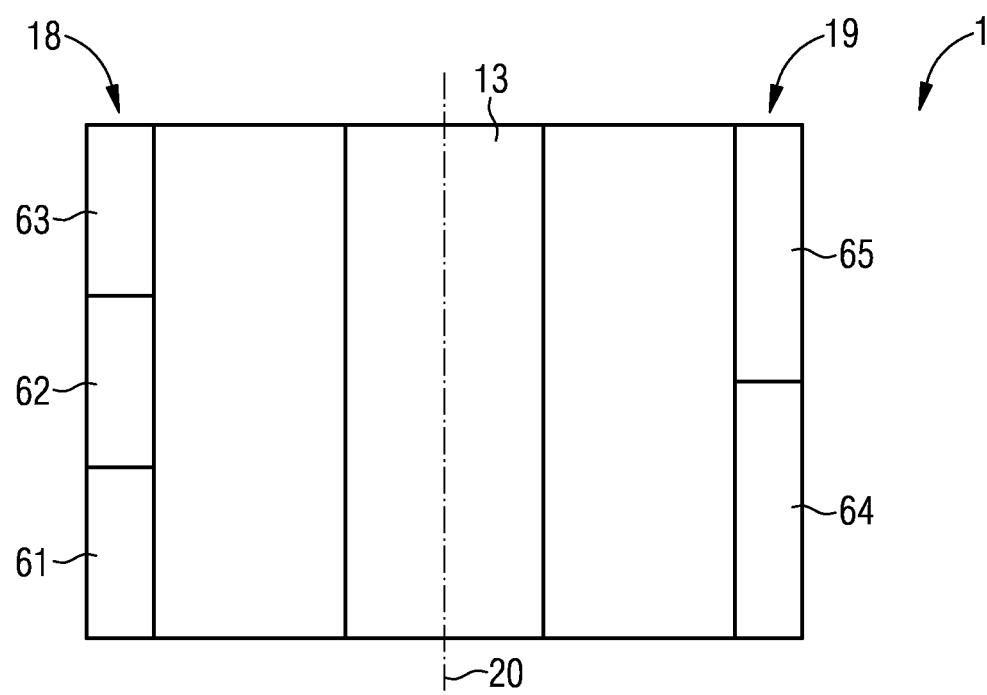
FIG. 3 illustrates a schematic plan view of a further embodiment of a semiconductor laser comprising side faces which are arranged in an inclined manner and which are subdivided into partial sections.
Figure 3:
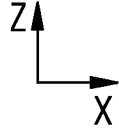

FIG. 3 shows, in a schematic illustration with a view of a top side, a semiconductor laser 1 comprising three partial sections 61, 62, 63 on the first side face 18, said partial sections comprising different inclination angles a with respect to the plane of the active zone. In this case, the second side face 19 is formed asymmetrically with respect to the first side face 18 and comprises two partial sections 64, 65 comprising different inclination angles a with respect to the plane of the active zone.

Figure 4:
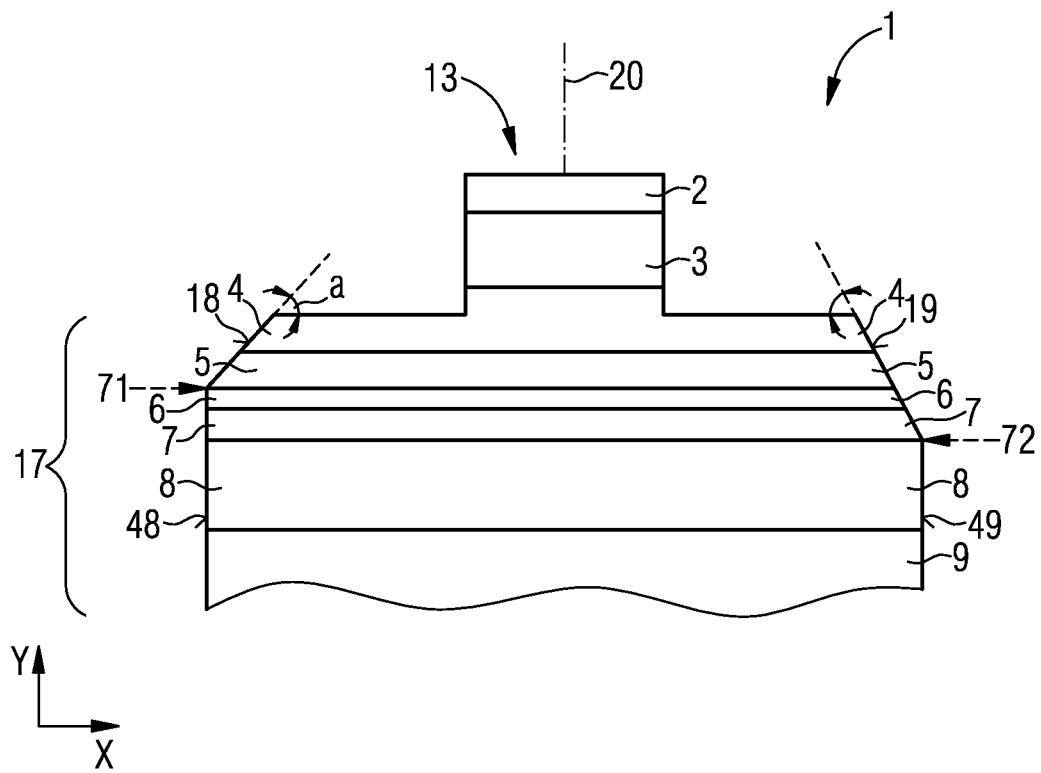
FIG. 4 illustrates a schematic partial cross section through a further embodiment of a semiconductor laser, wherein opposite side faces comprise different widths in the Y-direction.

FIG. 4 shows, in a schematic partial sectional illustration, a further embodiment of a semiconductor laser 1, wherein the first side face 18 is arranged in a manner inclined at an angle a with respect to the plane of the active zone. The first side face 18 extends right into the first waveguide layer 5 and transitions into the first sidewall 48 in a manner adjoining the active zone 6 via a first line 71. The first sidewall 48 is arranged perpendicularly to the plane of the active zone 6.

In this embodiment, the second side face 19 is arranged asymmetrically with respect to the first side face 18. The second side face 19 extends in the Y-direction right into the second cladding layer 8 and transitions into the second sidewall 49 at the level of the second cladding layer 8 via a second line 72. The second sidewall 49 is arranged perpendicularly to the plane of the active zone 6. Moreover, the inclination angles a of the first and second side faces may comprise different magnitudes. The first and second lines 71, 72 constitute transition regions that may be formed as edges or rounded regions. The illustration elucidates as an example the fact that the first and second side faces 18, 19 may comprise different inclination angles and may extend right into different layers.

Figure 5:
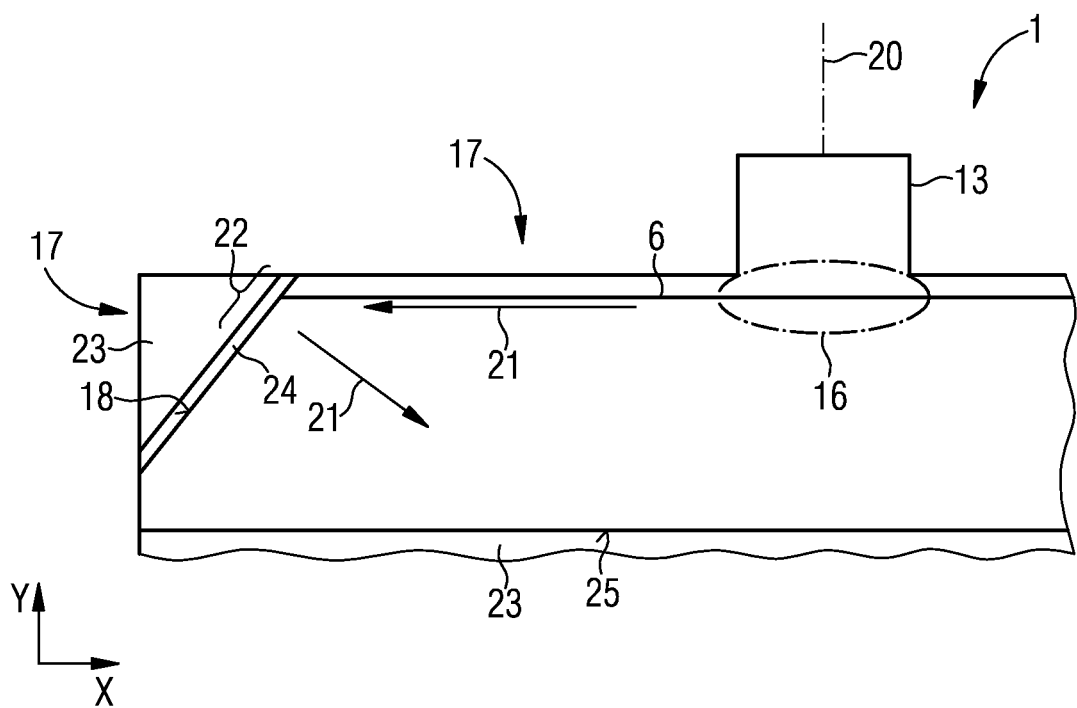
FIG. 5 illustrates a partial cross section through a further embodiment of a semiconductor laser, wherein an absorbing layer is applied on at least one side face.

FIG. 5 shows a partial cross section through a further embodiment of a semiconductor laser 1, which may be formed substantially in accordance with the embodiment from FIG. 2, but wherein a damping layer 23 is applied at least on a partial face of the first and/or of the second side face 18, 19. The semiconductor laser may be formed mirror-symmetrically in relation to the center plane 20. The absorbing layer 23 is configured to damp, in particular to suppress, a reflection of an incident electromagnetic radiation. To that end, the absorbing layer 23 may comprise a corresponding structure, for example, a corresponding layer construction, and/or a corresponding damping material.

Depending on the embodiment chosen, an absorbing layer 23 is arranged in particular only in an upper section 22 in relation to the Y-direction of the first side face 18. Likewise, the second side face 19 may analogously be provided with an absorbing layer 23, in particular with an absorbing layer 23 only in the upper section 22. The upper section 22 may extend in the Y-direction at least right into the plane of the first cladding layer, or right into the plane of the first waveguide layer, or right into the plane of the active zone, or right into the plane of the second waveguide layer or right into the plane of the second cladding layer or therebelow.

In the embodiment illustrated, the absorbing layer 23 comprises an insulation layer 24 bearing directly on the layer structure. The insulation layer 24 may be dispensed with if the absorbing layer 23 consists of an electrically nonconductive material. If the absorbing layer 24 comprises an electrically conductive material, however, then the insulation layer 24 prevents the individual layers of the layer structure from being short-circuited. In particular, the insulation layer 24 is intended to avoid a short circuit between the p-side and the n-side with bridging of the active zone 6.

The embodiments in FIGS. 3 and 4, too, may be provided at least partly with an absorbing layer in the region of the first and/or the second side face 18, 19, wherein an insulation layer 24 may also be provided depending on the material of the absorbing layer 23.

By way of example, germanium, silicon, indium or metals are appropriate as damping material for the absorbing layer. In the case of the embodiment of the absorbing layer comprising an electrically conductive material, an insulation layer 24 may be arranged between the absorbing layer 23 and the semiconductor layer of the semiconductor laser 1 in order to avoid electrical short circuits or undesired electrically conductive connections between the semiconductor layers. The insulation layer 24 may comprise or be formed from dielectrics such as, for example, silicon dioxide, aluminum oxide, silicon nitride. The insulation layer 24 may comprise a thickness in the range of 10 nm to 1 µm.

In particular, an insulation layer comprising silicon dioxide and an absorbing layer 23 comprising titanium may be used. Furthermore, aluminum may be used as absorbing layer 23 and aluminum oxide may be used as insulation layer 24. Moreover, silicon nitride may be used as absorbing layer 23 and as insulation layer 24.

Moreover, the absorbing layer 23 may be formed in the form of dielectric materials, this being formed as absorbing in the spectral range of the electromagnetic radiation generated by the semiconductor laser 1 by virtue of a targeted alteration of the composition.

Figure 6:
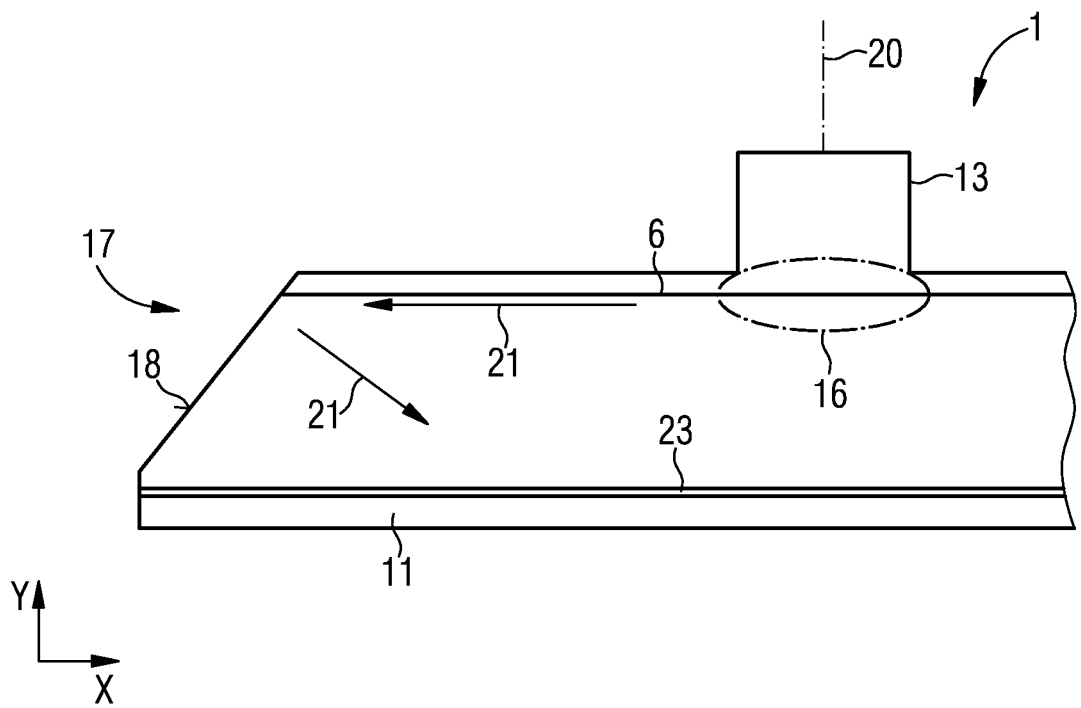
FIG. 6 illustrates a partial cross section through a further embodiment of a semiconductor laser, wherein an absorbing layer is arranged in the layer structure of the semiconductor laser.

FIG. 6 shows a schematic partial cross section through a further embodiment of a semiconductor laser, which is constructed substantially in accordance with FIG. 2, but wherein an absorbing layer 23 is formed in the semiconductor material below the active zone 6. The absorbing layer 23 may extend over the entire width and length, that is to say in the entire X-Z-plane in the main body 17 of the semiconductor laser 1. The absorbing layer 23 may be formed, for example, as an epitaxially deposited layer within the layer sequence of the semiconductor laser. The absorbing layer 23 may comprise, e.g., a band gap that is smaller than the energy of the electromagnetic radiation generated by the active zone 6. As a result, electromagnetic radiation 21 that is reflected, for example, by the first and/or by the second side face 18, 19 in the direction of the absorbing layer 23 may be absorbed by the absorbing layer 23.

The absorbing layer 23 may be produced, e.g., from a semiconductor layer by means of a corresponding doping or by means of a corresponding construction of a semiconductor layer. In particular, the absorbing layer 23 may comprise at least one quantum layer, wherein the quantum layer comprises a smaller band gap for an absorption of the electromagnetic radiation than energy of the electromagnetic radiation. The band gap may be produced, for example, by means of a corresponding concentration of impurity atoms and/or by means of a corresponding dopant concentration, and/or by means of a corresponding material composition and/or, in particular in the case of a layer comprising indium gallium nitride, by means of an increased indium concentration.

Outside of the semiconductor layer, by way of example, geranium, silicon, indium or metals are appropriate as absorbing layer 23. Moreover, the absorbing layer 23 may be formed in the form of dielectric materials, this being formed as absorbing in the spectral range of the electromagnetic radiation generated by the semiconductor laser 1 by virtue of a targeted alteration of the composition.

The absorbing layer 23 may be formed between the active zone 6 and a substrate in the layer construction of the semiconductor layers, in particular as an epitaxial layer. Depending on the embodiment chosen, the absorbing layer may preferably be arranged below the second waveguide layer 7. As a result, the formation of the desired laser mode in the mode space 16 is influenced to a lesser extent or hardly influenced by the absorbing layer 23. The absorbing layer 23 may be arranged in the second cladding layer 8 or in the second semiconductor layer 9. Moreover, the absorbing layer 23 may be arranged between the second cladding layer 8 and the second semiconductor layer 9.

In the case of a material system comprising gallium nitride for the construction of the semiconductor layers, the absorbing layer may consist of aluminum gallium indium nitride, for example, wherein the band gap is smaller than the energy of the electromagnetic radiation 21 generated by the active zone 6.

In the case of the configuration of the semiconductor layers comprising a material system based on gallium arsenide, the absorbing layer 23 may consist of indium gallium arsenide, for example. Optionally, the absorption of the electromagnetic radiation by the absorbing layer 23 may be additionally increased by means of an increased doping of the absorbing layer.

Figure 7:
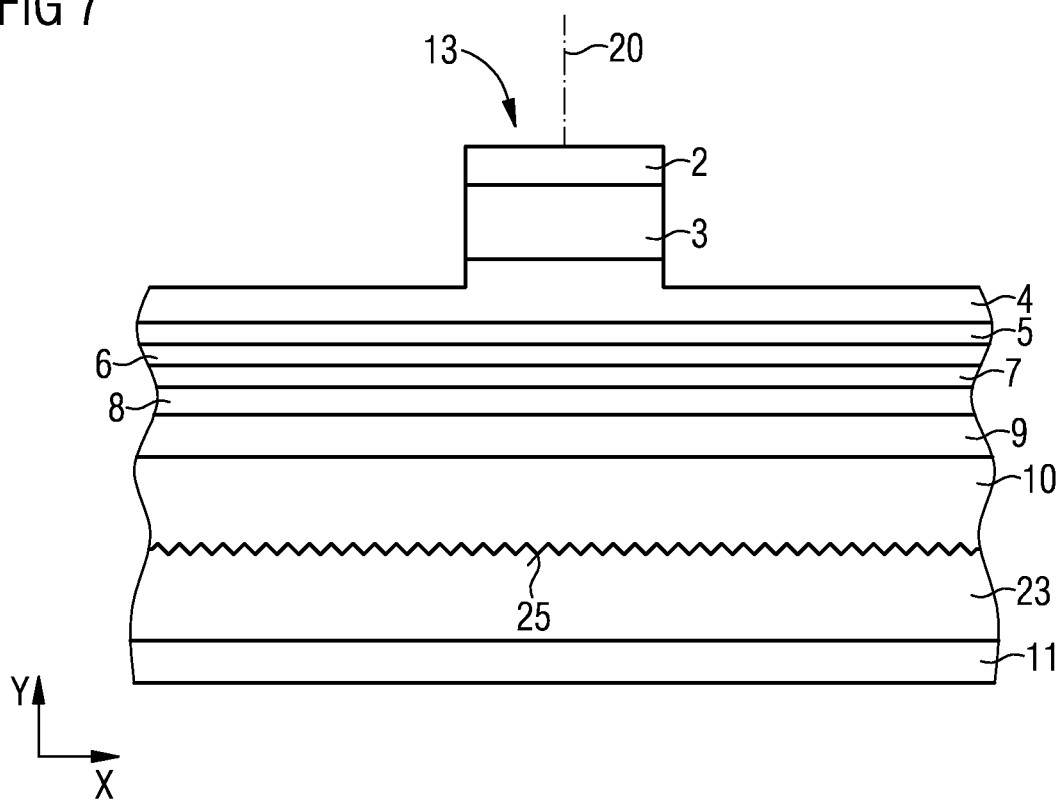
FIG. 7 illustrates a schematic illustration of a partial cross section through a further embodiment of a semiconductor laser, wherein an absorbing layer is provided on an underside of the substrate.

Moreover, an absorbing layer 23 comprising a metal or a metal layer sequence may be formed on an underside of the semiconductor layer structure, in particular on an underside 25 of the substrate 10. The metal or the metal layer sequence may comprise, for example, titanium, nickel, aluminum, platinum, palladium, rhodium and/or gold. Furthermore, the underside 25 of the substrate 10 may be roughened, as is illustrated in FIG. 7. Moreover, the absorbing layer 23 may be dispensed with and only the underside of the substrate or of the semiconductor layer structure may comprise a roughened underside 25. In these embodiments, too, a reflection of an electromagnetic radiation 21 back into the region of the mode space 16 is hindered or prevented.

The underside of the semiconductor layer structure in particular of the substrate may be produced, for example, by dry-chemical etching by means of argon, nitrogen, BC13, C12 etc. or by means of wet-chemical etching using KOH, for example.

In one embodiment, the absorbing layer 23 is applied at least as a constituent of the second contact layer 11.

The embodiments in FIGS. 6 and 7 can be combined with the embodiments in FIGS. 3 to 5.

Figure 8:
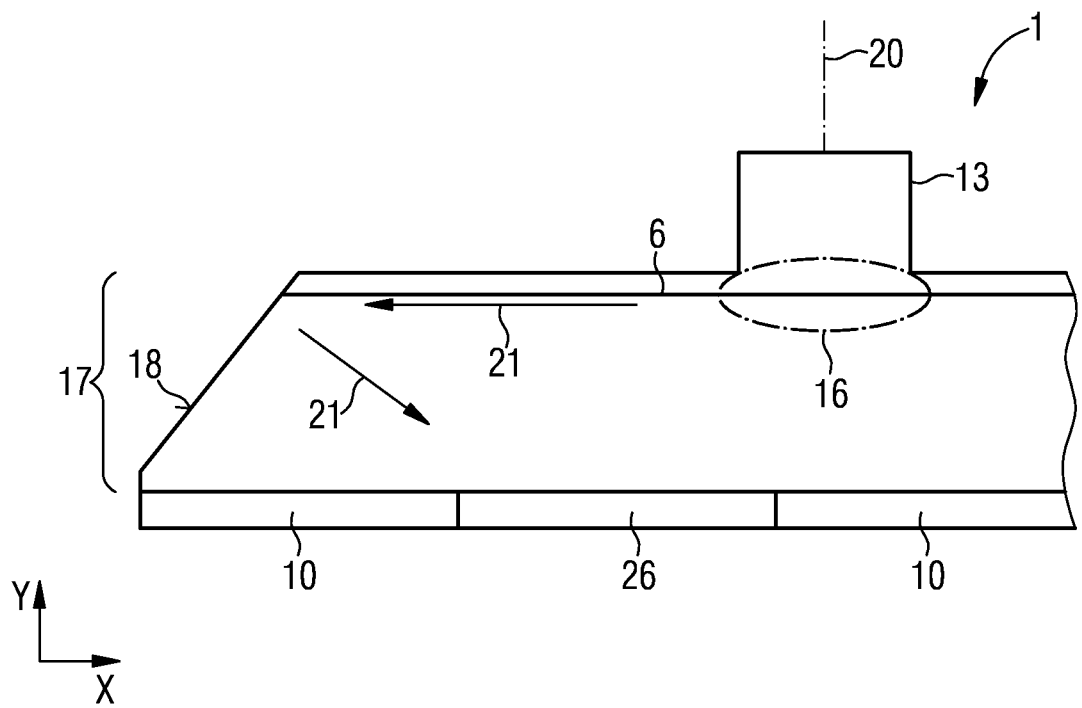
FIG. 8 illustrates a schematic illustration of a partial cross section through a further embodiment of a semiconductor laser, wherein a section of the substrate is formed as an absorbing region.

FIG. 8 shows a schematic cross section through a further embodiment of a semiconductor laser 1, which is formed substantially in accordance with FIG. 1, but wherein in this embodiment an absorbing region 26 is formed in the substrate 10. The absorbing region 26 may extend over a part of the width in the X-direction of the semiconductor laser 1 and/or over at least one part of the length in the Z-direction of the semiconductor laser 1. In particular, the absorbing region 26 may be formed in the X-direction between a region of the mode space 16 and the first side face 18 arranged in an inclined manner. Analogously, a further absorbing region 26 may be formed in the X-direction between the mode space 16 and the second side face 19 in the substrate 10. An absorbing region 26 ensures that an electromagnetic radiation 21 reflected by the side faces 18, 19 in the direction of the substrate 10 is at least partly absorbed in the absorbing region 26. The absorbing region 26 may extend in a range of between 5 and 100% of the width of the main body 17 in the X-direction over the substrate. Moreover the absorbing region 26 may preferably extend in a range of between 20 and 98% of the width, that is to say in the X-direction over the width of the substrate. The absorbing region 26 may preferably extend over the entire length of the semiconductor laser 1 in the Z-direction.

Figure 9:
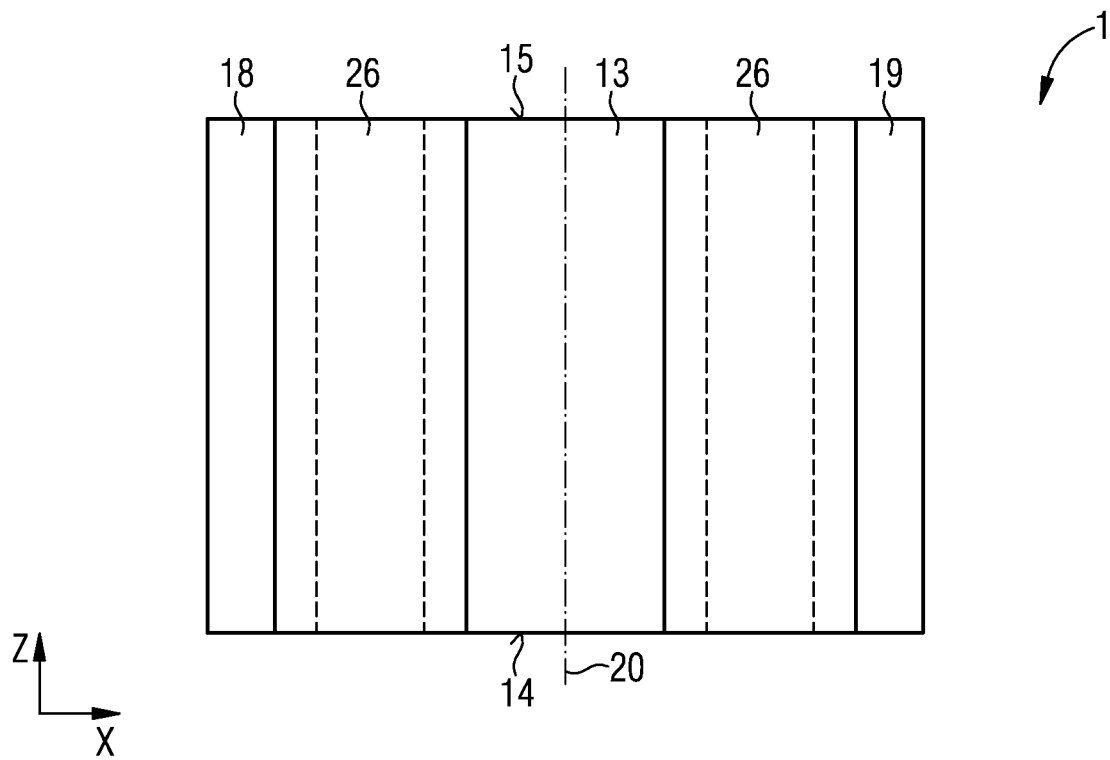
FIG. 9 shows a schematic plan view of the semiconductor laser from FIG. 8.

FIG. 9 shows, in a schematic illustration from above, a semiconductor laser in which absorbing regions 26 are arranged in the substrate 10 on both sides in relation to the ridge 13. The absorbing regions 26 are illustrated by dashed lines.

Depending on the embodiment chosen, the substrate 10 may consist in particular completely of an absorbing material. Moreover, individual regions of the substrate may be more highly absorbent for the electromagnetic radiation generated by the active zone 6. To that end, by way of example, the substrate or parts of the substrate may be produced with the aid of an ELOG method and comprise coalescence regions that absorb the electromagnetic radiation to a greater extent. By way of example, in the case of a gallium nitride material system for the formation of the semiconductor layers of the semiconductor laser 1, the substrate may consist of indium gallium nitride or of silicon carbide, both of which absorb electromagnetic radiation. Moreover, an absorbing layer, for example, in the form of a contact layer may be formed on an underside of the substrate.

The substrate 10 may consist, for example, of gallium nitride, indium gallium nitride, aluminum gallium nitride, gallium arsenide, gallium phosphide, silicon, silicon carbide, sapphire, indium phosphide, etc. The embodiments in FIGS. 8 and 9 may be combined with the embodiments in FIGS. 2 to 7. Moreover, nickel, oxygen, magnesium, beryllium, boron, antinomy, phosphorus, xenon, chromium, hydrogen, titanium, copper, silicon, germanium, arsenic, indium, gold, etc. may be used as implantation substances for the substrate in order to increase the absorption property for the electromagnetic radiation.

Figure 10:
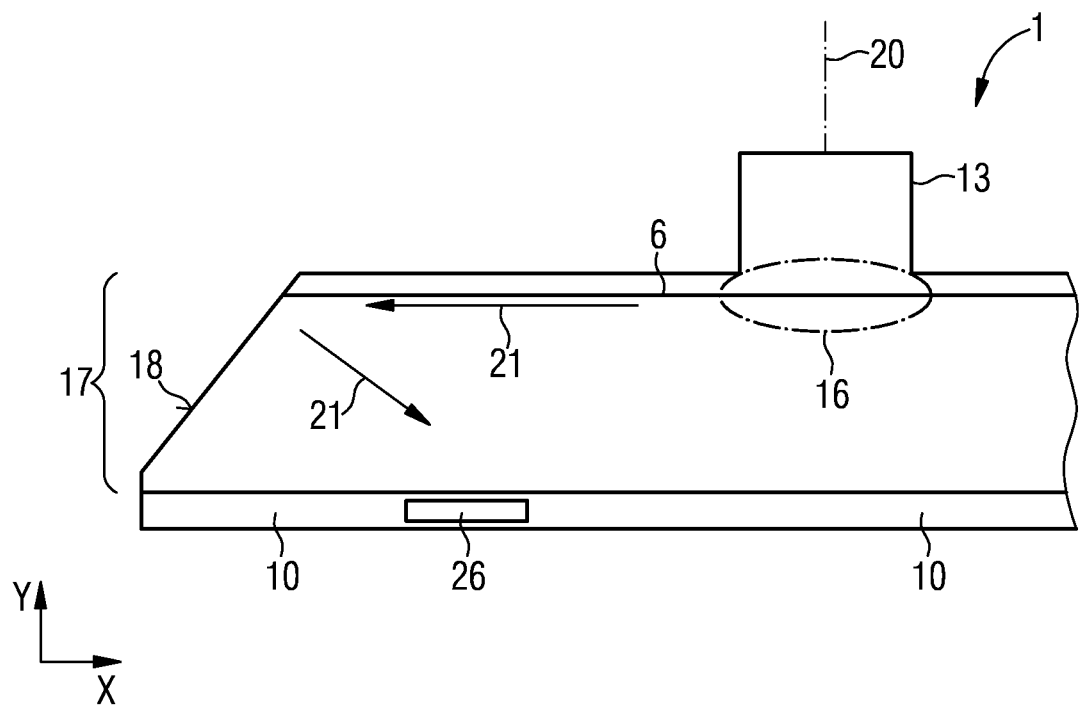
FIG. 10 illustrates a schematic illustration of a partial cross section through a further embodiment of a semiconductor laser, wherein an absorbing region is formed in the substrate.

FIG. 10 shows, in a schematic illustration, a partial cross section through a further embodiment of a semiconductor laser, which is constructed substantially in accordance with FIG. 8, but wherein the absorbing region 26 is arranged in a partial region within the substrate 10. The absorbing region 26 may be produced, for example, with the aid of an implantation. The absorbing region 26 may extend over the entire width and/or over the entire length of the semiconductor laser in the substrate.

Figure 11:
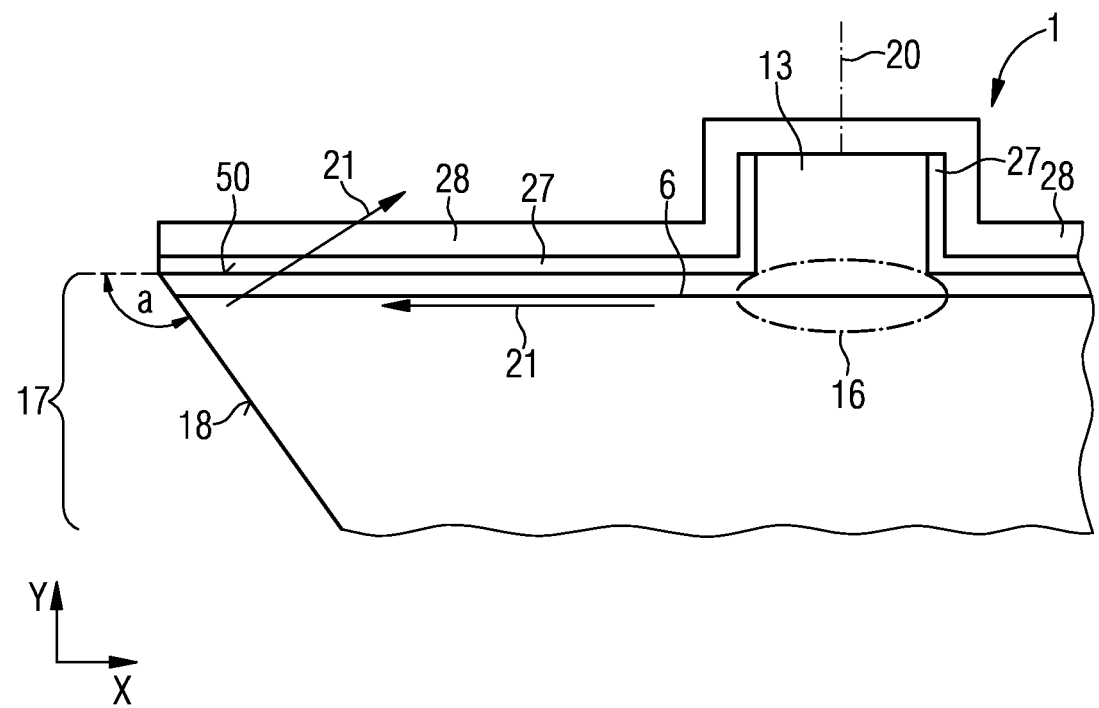
FIG. 11 illustrates a schematic illustration of a partial cross section through a further embodiment of a semiconductor laser, wherein the side wall is arranged at an acute angle.

FIG. 11 shows, in a schematic illustration, a partial cross section through a further embodiment of a semiconductor laser 1, which is formed substantially in accordance with FIG. 2, but wherein in this embodiment the first and/or the second side face 18, 19 are/is arranged in a manner inclined at an angle a of between 91° and 179°, preferably inclined between 135° and 155°, with respect to the plane of the active zone 6. In this case, the first and/or the second side face 18, 19 are/is formed in such a way that the width of the semiconductor laser in the X-direction becomes wider in the direction of a top side 50 of the main body 17. As a result, an electromagnetic radiation 21 that is emitted from the mode space 16 in the direction of the first and/or the second side face 18, 19 is reflected upward in the direction of the ridge 13 or thereabove. Moreover, a top side 50 of the semiconductor layer structure may be covered with a second insulation layer 27 laterally with respect to the ridge 13. A metal layer 28 for electrically contacting the top side of the ridge 13 may be provided on the second insulation layer 27. The metal layer 28 absorbs the electromagnetic radiation 21 reflected upward by the side faces 18, 19. The second side face 19 may be arranged mirror-symmetrically with respect to the first side face 18 in relation to the center plane 20.

The first and/or the second side face 18, 19 may be introduced into the semiconductor layer structure of the semiconductor laser 1 at the desired angle a, for example, with the aid of a sawing method. The embodiment in FIG. 11 may also be combined with the embodiments in FIGS. 3 to 10.

In the case of the embodiment of the semiconductor laser comprising a gain-guided laser mode, the first and second side faces 18, 19 in accordance with FIGS. 2 to 11 might extend as far as a top side of the first semiconductor layer 3.

Figure 12:
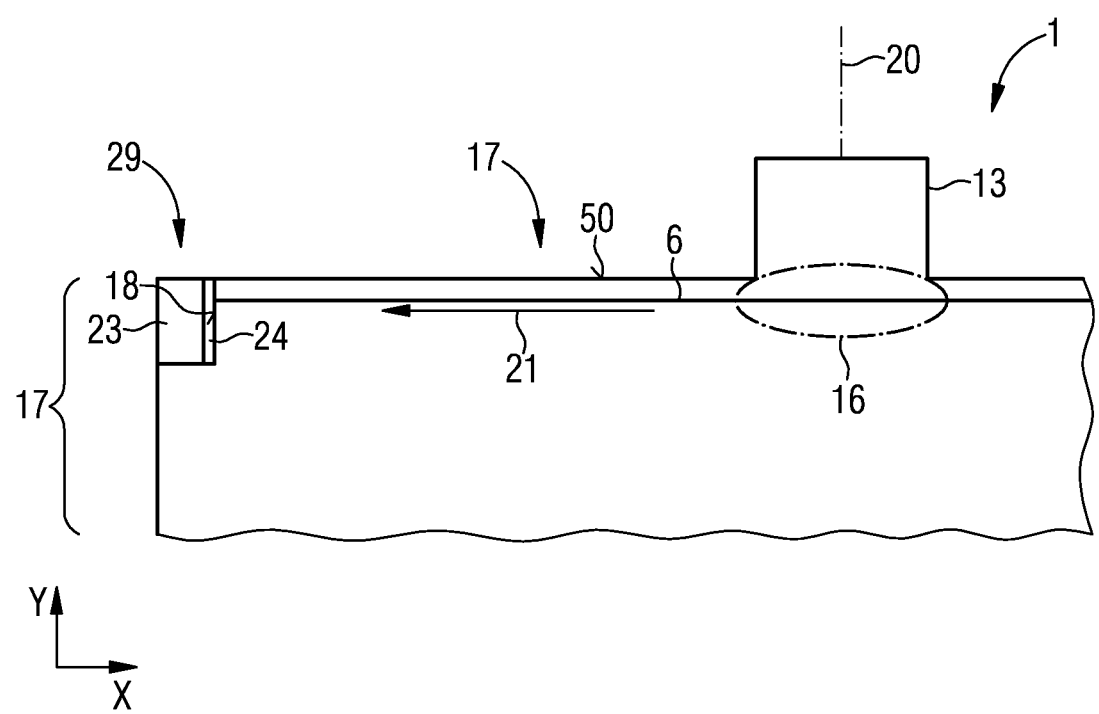
FIG. 12 illustrates a schematic illustration of a partial cross section through a further embodiment of a semiconductor laser, wherein a trench with an absorbing layer is formed at least at a side face.

FIG. 12 shows a schematic partial cross section through a further embodiment of a semiconductor laser 1, which is formed substantially in accordance with FIG. 2, wherein the first side face 18 and the second side face 19, which is not illustrated, are formed perpendicularly to the plane of the active zone 6. Moreover, in an upper section 22 of the first and/or of the second side face 18, 19, an absorbing layer 23 is applied on the first and/or the second side face 18, 19. To that end, a trench 29 may be introduced into the top side of the semiconductor layer structure of the semiconductor laser 1 laterally with respect to the mode space 16. The trench 29 may be partly or completely filled with the absorbing layer 23. In particular, the first and/or non-illustrated second side face 18, 19 are/is covered with the absorbing layer 23. The trench 29 extends in the Y-direction preferably to a depth below the active zone 6, in particular below the second waveguide layer 7. The absorbing layer 23 may extend over the entire length of the side face 18, 19 of the semiconductor laser 1. The arrangement of the absorbing layer 23 leads to an increased absorption of the electromagnetic radiation 21 that is emitted onto the first and/or the second side face 18, 19. The absorbing layer 23 may be constructed from the materials indicated above. The embodiment in FIG. 12 may be combined with the other embodiments. If the absorbing layer 23 consists of an electrically conductive material, it is advantageous if an insulation layer 24 is formed between the semiconductor layers and the layer 23 in order to avoid electrical short circuits between the semiconductor layers, in particular between a p-side and an n-side.

Figure 13:
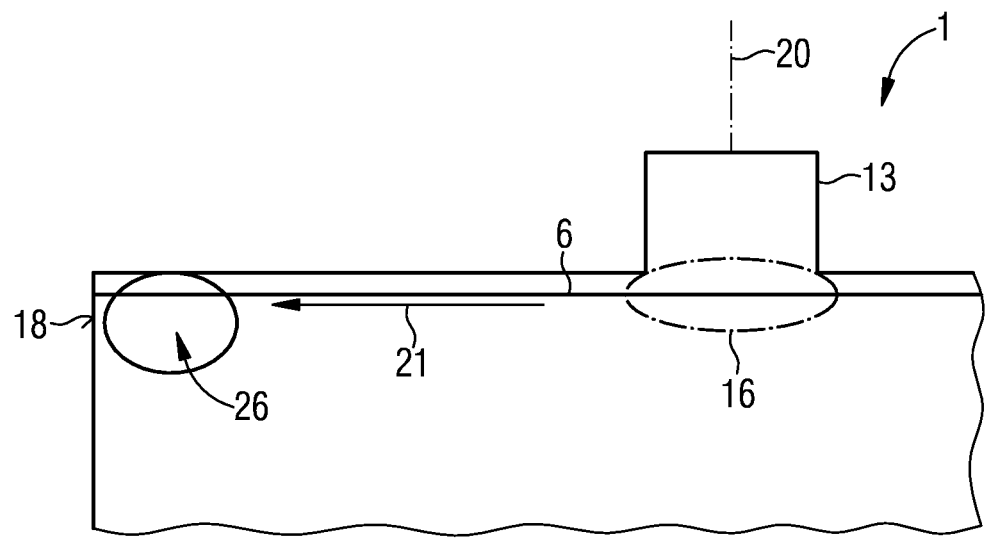
FIG. 13 illustrates a schematic illustration of a partial cross section through a further embodiment of a semiconductor laser, wherein an absorbing region is formed in at least one semiconductor layer.
Figure 13:
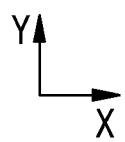

FIG. 13 shows a schematic partial cross section through a further embodiment of a semiconductor laser 1, which is formed substantially in accordance with FIG. 1. Moreover, an absorbing region 26 is formed in the semiconductor layers of the semiconductor layer structure, said absorbing region being illustrated schematically as an oval area. The absorbing region 26 is arranged alongside the mode space 16 and between the ridge 13 and the first side face 18. Moreover, an absorbing region may also be formed between the ridge 13 and the second side face 19, which is not illustrated.

The absorbing regions 26 may extend from the top side of the semiconductor layer structure, i.e., e.g., proceeding from the first cladding layer in the Y-direction to below the second waveguide layer, in particular the second cladding layer. Moreover, the absorbing region 26 may extend in the Z-direction over a partial length of the semiconductor laser or over the entire length of the semiconductor laser. Furthermore, corresponding absorbing regions may be formed in the semiconductor material on both sides, that is to say in the region of the first side face 18 and in the region of the second side face 19. The absorbing regions may be arranged and/or formed on the opposite sides in relation to the ridge 13 mirror-symmetrically with respect to the center plane 20 or asymmetrically with respect to the center plane 20.

The absorbing region 26 may be produced in the semiconductor material with the aid of a diffusion or implantation of various materials. By way of example, Ni O, Mg, Be, B, Sb, P, Xe, Cr, Ti, Cu, Si, Ge, As, In, H, Au, etc. may be used as doping or implantation materials. With the aid of the diffusion or implantation of the materials described, e.g., the band gap of the semiconductor layers in the absorbing region 26 may be changed in such a way that a higher absorption for the electromagnetic radiation 21 of the active zone 6 is achieved.

Electromagnetic radiation 21 that is emitted from the mode space 16 is absorbed by the absorbing region 26. The absorbing region 26 may also be formed in the active zone 6 outside the mode space 16. To that end, the active zone in the absorbing region 26 may comprise, for example, thicker quantum films and/or a corresponding material composition in order to absorb the electromagnetic radiation 21.

The absorbing region 26 may be realized in the active zone 6, for example, by means of a quantum well structure with a reduced band gap, wherein, for example, an increased indium content is provided. The absorbing regions may be produced, for example, by the absorbing regions being grown under a reduced temperature during the epitaxy process. In the case of indium gallium nitride, a reduced temperature leads to an increased incorporation of indium into the layer grown.

During the deposition of the semiconductor layers on the substrate, the substrate bears on a carrier. The type of mechanical contact between the carrier and the substrate influences the temperature of the substrate during the deposition of the semiconductor layers. The carrier may be provided with a heating system. If there is reduced mechanical contact locally between the carrier and the substrate, then the temperature of the substrate, on account of the reduced thermal coupling to the carrier, is lower than in other regions in which there is a better mechanical contact and hence a better heat conduction. This effect can be utilized for influencing the local temperature on the substrate during the deposition of the semiconductor layer. The absorbing regions are produced by means of a targeted local influencing of the temperature during the deposition of the semiconductor layers in the regions in which the absorbing regions are intended to arise.

Depending on the material system, it is possible to utilize an increased local temperature or a decreased local temperature during the deposition of the semiconductor layers in order to produce the absorbing regions 26. In order to reduce the temperature in the desired absorbing regions, by way of example, an underside of the substrate onto which the semiconductor layers are grown may be structured in such a way that a recess is provided in the absorbing region. A poorer linking of the substrate to a carrier is achieved by means of the recess. Depending on the embodiment chosen, the carrier may also be structured correspondingly with recesses in the surface or with elevations on the surface in order that the substrate in defined regions has a better or poorer mechanical contact with the carrier. Consequently, different temperatures may be set during the same epitaxy process in defined regions of the substrate. As a result, it is possible to produce local regions comprising more or less absorbent properties in the semiconductor layers and in particular in the region of the active zone laterally with respect to the mode space 16.

Figure 14:
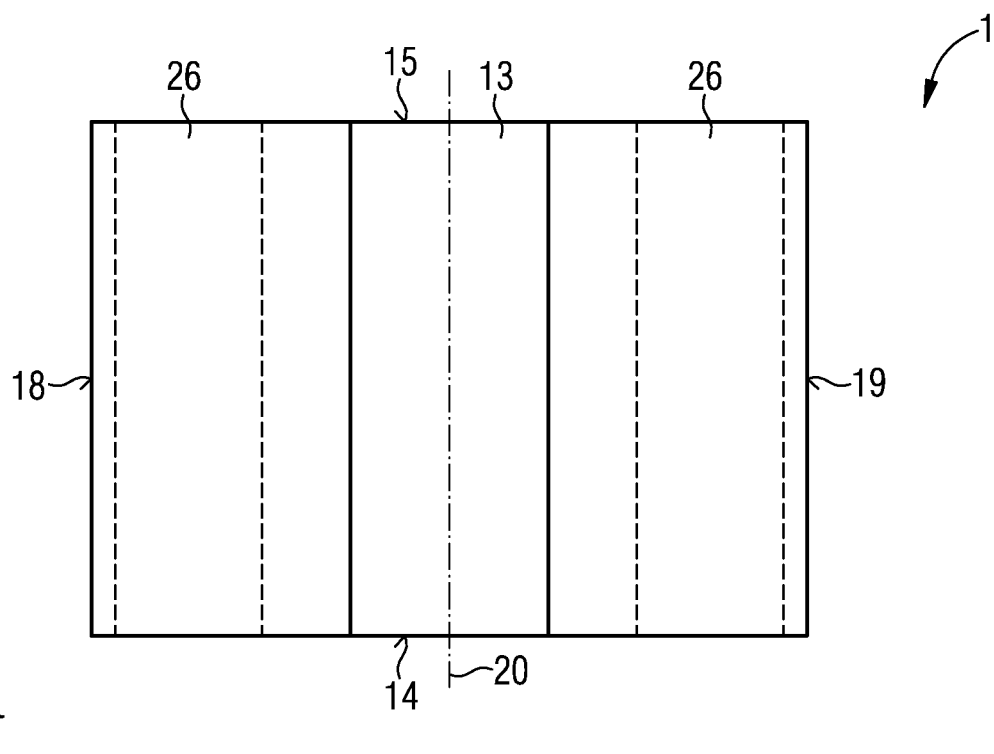
FIG. 14 illustrates a schematic illustration of a plan view of the semiconductor laser from FIG. 13.
Figure 14:
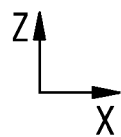

FIG. 14 shows a schematic view from above of a semiconductor laser 1 formed in accordance with FIG. 13, wherein the absorbing regions 26 are illustrated schematically with the aid of dashed lines.

Figure 15:
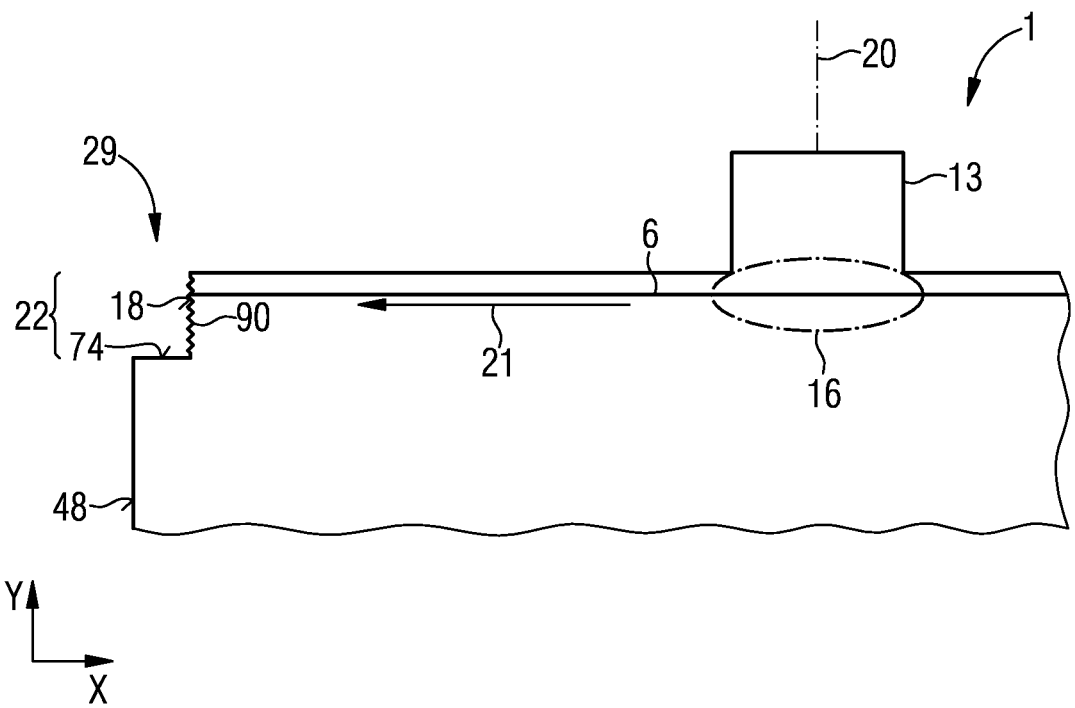
FIG. 15 illustrates a schematic partial cross-sectional illustration of a further embodiment of a semiconductor laser, wherein at least one partial region of the first side face is provided with a mechanical structure for reducing reflection.

FIG. 15 shows a schematic partial cross section through a further embodiment of the semiconductor laser, wherein the first side face 18 comprises a mechanical structure 90 in an upper section 22, said mechanical structure hindering a reflection of an incident electromagnetic radiation and/or leading to an absorption of the incident electromagnetic radiation. The mechanical structure 90 may be realized in the form of steps, dislocations or a roughness of the surface of the first side face 18. The second side face 19 may also be formed mirror-symmetrically in an analogous manner. In the exemplary embodiment illustrated, the first side face 18 is arranged vertically and a trench 29 is provided, in which the first side face 18 is formed. The trench 29 is led in the X-direction as far as the first sidewall 48. Depending on the embodiment chosen, the first side face 18 may also be arranged in a manner inclined at an angle with respect to the plane of the active zone. Moreover, the trench 29 may also be dispensed with. In the case of this embodiment, the first side face 18 and the first sidewall 48 are arranged in one plane.

The roughness of the first and/or of the second side face 18, 19 may lie in the range of 1 nm to 30 μm, in particular in the range of 10 nm to 10 μm, preferably in the range of 100 nm to 5 μm. The roughened first and/or second side face 18, 19 may be produced, for example, with the aid of wet-chemical etching by means of KOH or with the aid of dry etching, for example, with the aid of N, Ar, BCl3, Cl2. The structure of the roughness may be formed in a directional or diffuse fashion. The roughness may indicate the average roughness. The average roughness indicates the average distance between a measurement point on the surface and a central line. The central line intersects the actual profile within the reference length such that the sum of the profile deviations (relative to the central line) becomes minimal. The average roughness thus corresponds to the arithmetic mean of the deviation from the central line in terms of absolute value. The average roughness of the first and/or second side face 18, 19 may be between 1 nm and 30 μm, as explained above.

Figure 16:
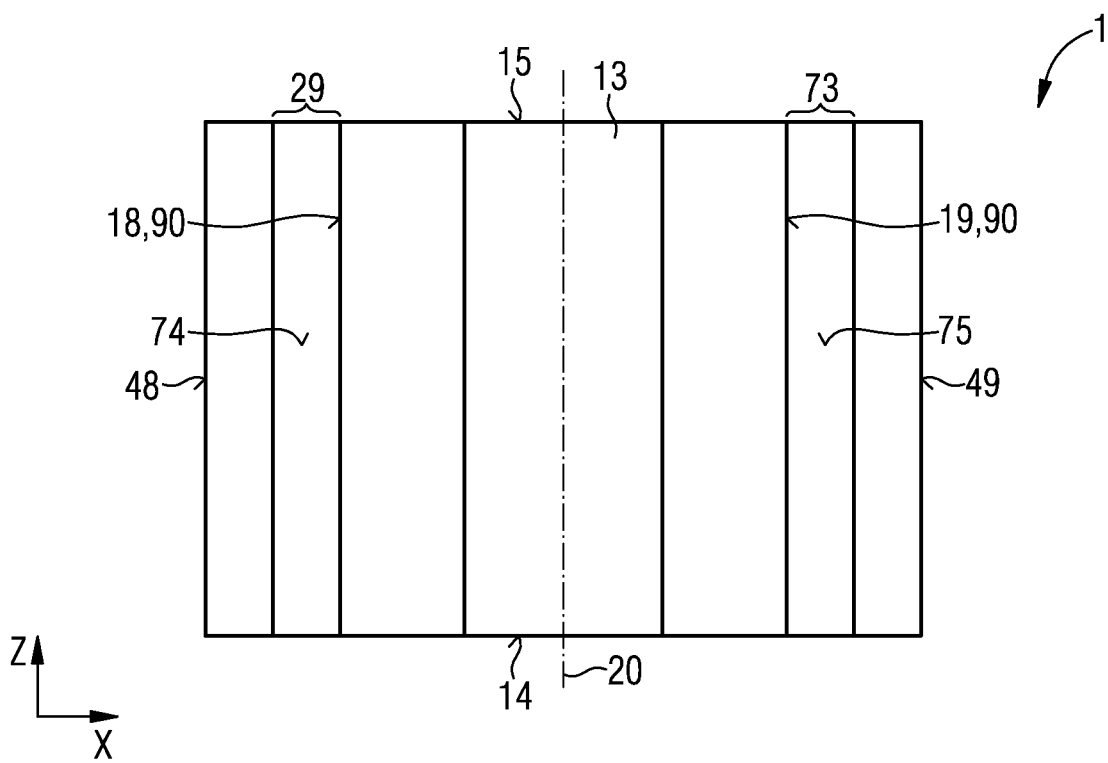
FIG. 16 illustrates a schematic plan view of a further embodiment of a semiconductor laser comprising mechanical structures.

FIG. 16 shows, in a schematic illustration, a further embodiment of a semiconductor laser 1 with a view of a top side of the semiconductor laser 1, which is formed substantially in accordance with FIG. 15, but wherein two trenches 29, 73 are illustrated, which are arranged between the ridge 13 and the sidewalls 48, 49 of the main body 17. The trenches 29, 73 are arranged parallel to the ridge 13 and formed mirror-symmetrically with respect to the center plane 22. Each trench 29, 73 comprises, at an inner side facing the ridge 13, a first and respectively a second side face 18, 19 comprising a mechanical structure 90 that at least reduces a reflection of an electromagnetic radiation 21, as explained with reference to FIG. 15. The trenches 29, 73 are laterally spaced apart from the first and respectively the second sidewall 48, 49. Depending on the embodiment chosen, the trenches 29, 73 may also extend laterally as far as the sidewalls 48, 49. Depending on the embodiment chosen, the mechanical structure 90 may extend only over a partial length of the first and/or of the second side face. Moreover, the trenches 29, 73 may extend only over partial lengths of the semiconductor laser. The arrangement of the ridge 13 in the center plane constitutes only one of various possible embodiments. The ridge 13 may also be arranged outside the center plane 20 in all embodiments.

Figure 17:
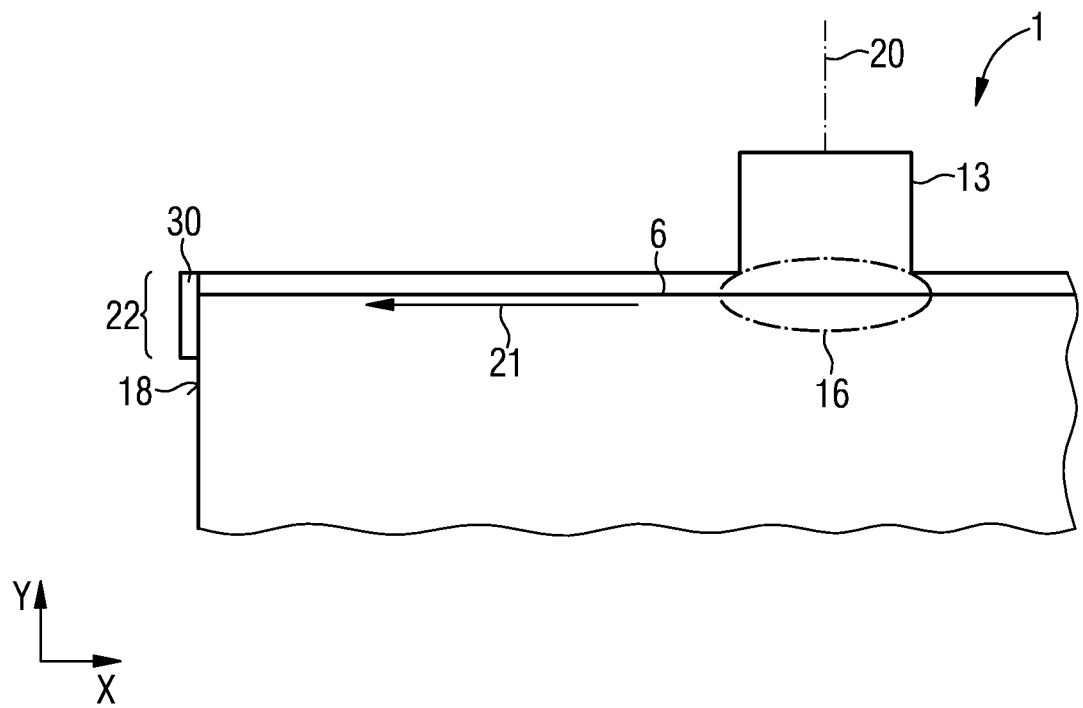
FIG. 17 illustrates a schematic partial cross section through a semiconductor laser, wherein an antireflective layer is provided at least at the first side face.

FIG. 17 shows, in a schematic illustration, a partial cross section through a further embodiment of a semiconductor laser 1, which is formed substantially in accordance with FIG. 1. An antireflective layer 30 is applied in an upper section 22 of the first side face 18. The upper section 22 extends in the Y-direction at least right into the first waveguide layer or in particular to beyond the second waveguide layer, in particular to beyond the second cladding layer. The antireflective layer 30 may extend over the entire length of the side face 18 in the Z-direction. Moreover, depending on the embodiment chosen, the antireflective layer may also be formed only in sections along the length of the semiconductor laser. Dielectric layers such as, for example, silicon oxide, aluminum oxide, titanium oxide, zirconium oxide, tantalum oxide, etc. or combinations thereof or layer stacks comprising at least one of said materials may be used for the formation of the antireflective layer 30. A reflection of an electromagnetic radiation 21 at the first side face 18 may be reduced with the aid of the antireflective layer 30. The second side face 19 may also be formed and be provided with an antireflective layer 30 in an analogous fashion.

Figure 18:
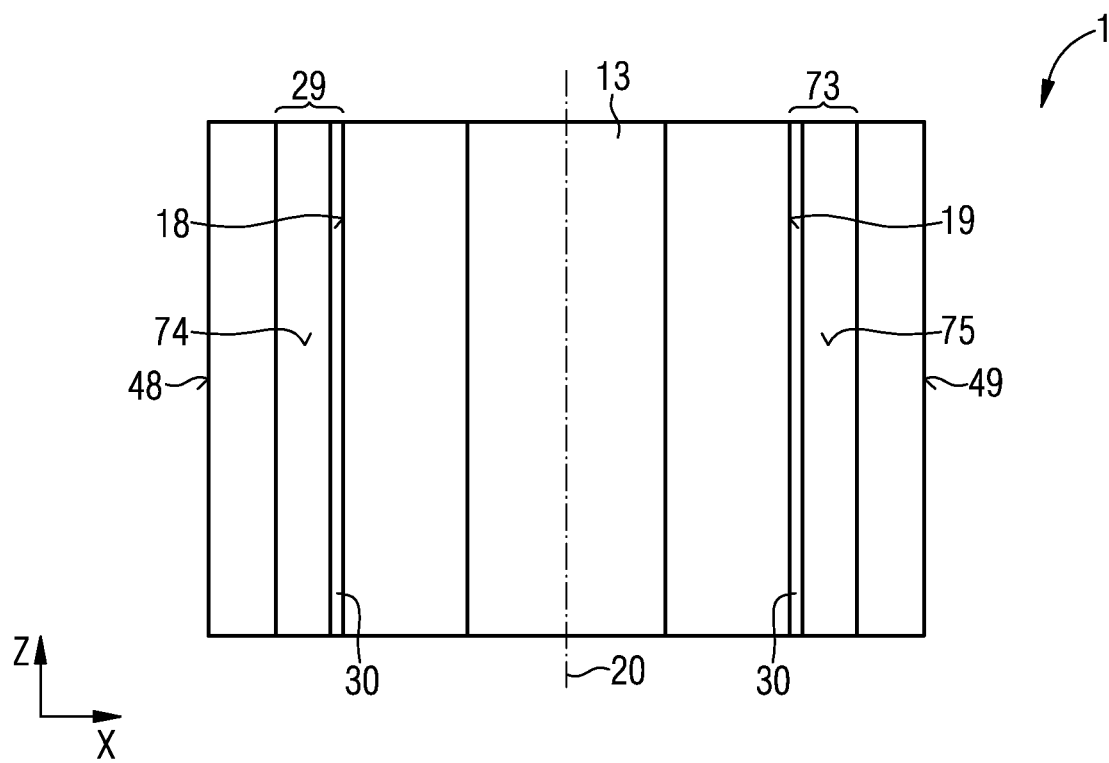
FIG. 18 illustrates a schematic plan view of a semiconductor laser comprising antireflective layers.

FIG. 18 shows, in a schematic illustration, a further embodiment of a semiconductor laser 1 with a view of a top side of the semiconductor laser 1, which is formed substantially in accordance with FIG. 17, but wherein two trenches 29, 73 are provided, which are arranged between the ridge 13 and the sidewalls 48, 49 of the main body 17. The trenches 29, 73 are arranged parallel to the ridge 13 and formed mirror-symmetrically with respect to the center plane 22. Each trench 29, 73 comprises, at an inner side facing the ridge 13, a first and respectively a second side face 18, 19 comprising an antireflective layer 30 that at least reduces a reflection of an electromagnetic radiation 21, as explained with reference to FIG. 15. Depending on the embodiment chosen, a bottom face 74, 75 of the trenches 29, 73 may also comprise an antireflective layer 30 that at least reduces or suppresses a reflection of an electromagnetic radiation 21.

Depending on the embodiment chosen, the antireflective layer 30 may extend only over a partial length of the first and/or of the second side face 18, 19. Moreover, the trenches 29, 73 may extend only over partial lengths of the semiconductor laser. Furthermore, the trenches 29, 73 may extend laterally as far as the sidewalls 48, 49.

Figure 19:
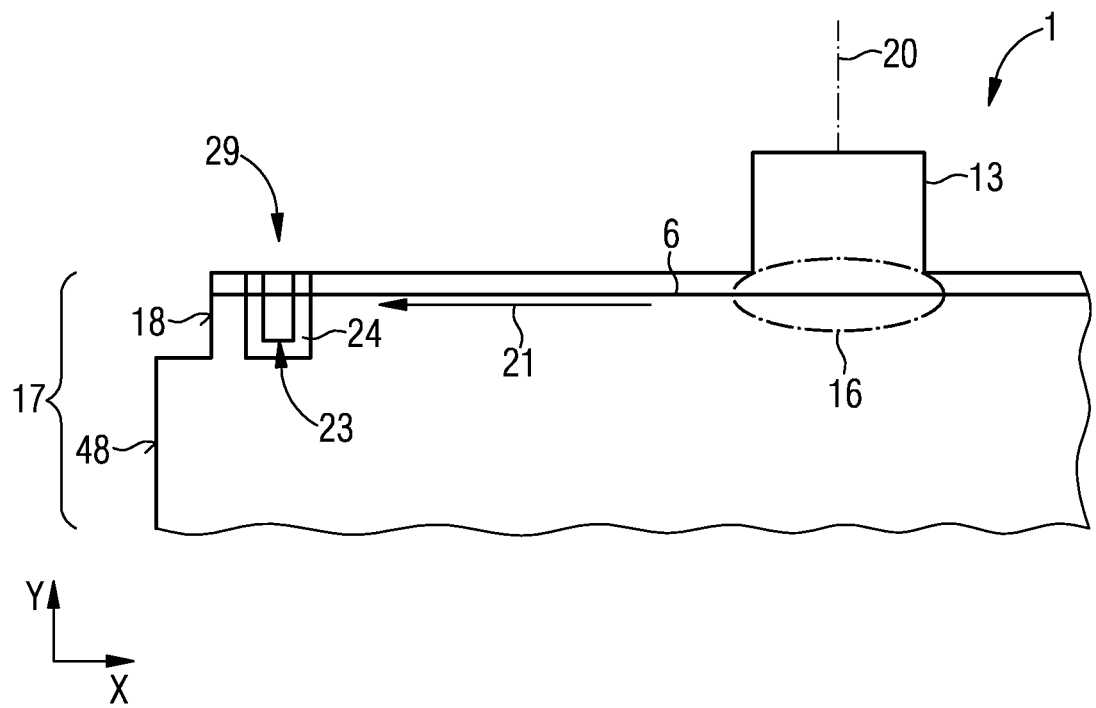
FIG. 19 illustrates a schematic partial cross section through a semiconductor laser comprising a trench with an absorbing layer.

FIG. 19 shows, in a schematic illustration, a partial cross section through a further embodiment of a semiconductor laser 1, which is formed substantially in accordance with FIG. 1. In this embodiment, a trench 29 is provided between the mode space 16 and the first side face 18. The trench 29 is at least partly provided or filled with an absorbing layer 23. In this case, e.g., only a side face of the trench 29 that faces the ridge may be covered with the absorbing layer 23. The trench 29 with the absorbing layer 23 preferably extends over the entire length of the semiconductor laser 1. Relative to the first sidewall 48 of the main body 17, the first side face 18 may be recessed in the X-axis in the direction of the ridge 13, as illustrated. Moreover, the first side face 18 may also be arranged in one plane with the first sidewall 48.

Figure 20:
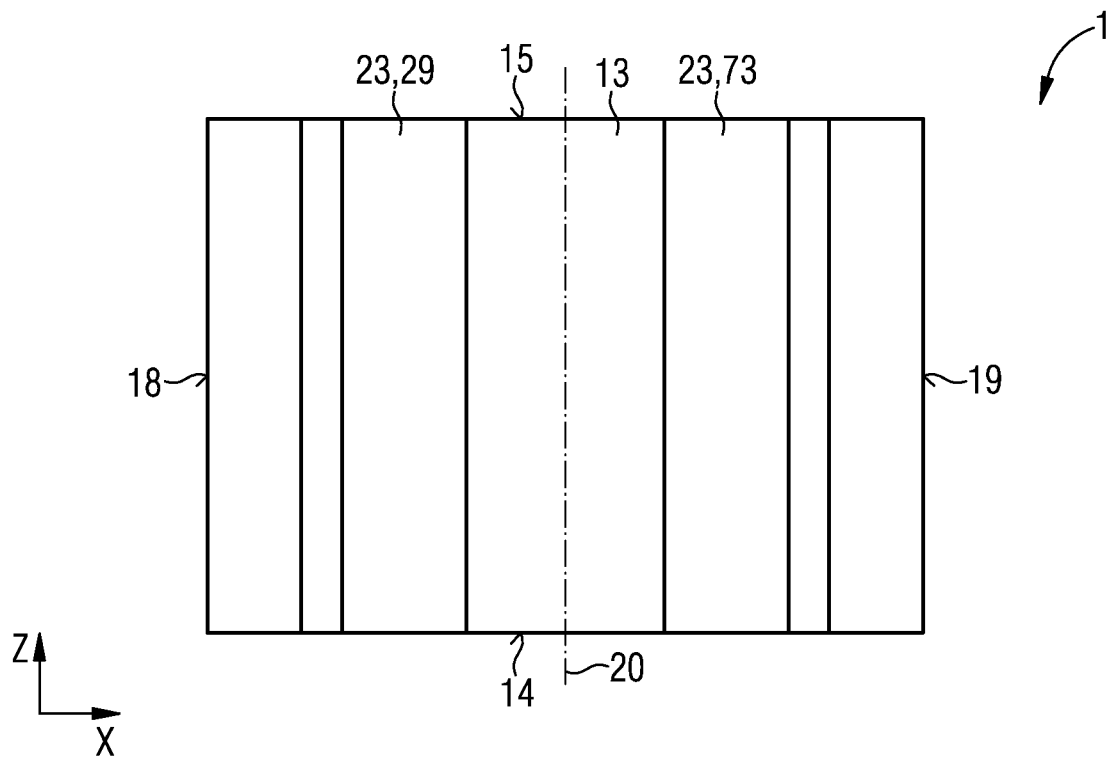
FIG. 20 illustrates a schematic plan view of a semiconductor laser comprising trenches with absorbing layers.

FIG. 20 shows, in a schematic illustration, a further embodiment of a semiconductor laser 1 with a view of a top side of the semiconductor laser 1, which is formed substantially in accordance with FIG. 19, but wherein two trenches 29, 73 are provided, which are arranged between the ridge 13 and the side faces 18, 19. Moreover, the first and the second side face 18, 19 simultaneously form the first and respectively the second sidewall of the semiconductor laser 1. The trenches 29, 73 are arranged parallel to the ridge 13 and formed mirror-symmetrically with respect to the center plane 20. Each trench 29, 73 comprises at side faces an absorbing layer 23 that at least reduces a reflection of an electromagnetic radiation 21, as explained with reference to FIG. 19. Moreover, each trench 29, 73 may be filled with the absorbing layer 23.

Depending on the embodiment chosen, the absorbing layers 23 may extend only over a partial length of the trenches 29, 73. Moreover, the trenches 29, 73 may extend only over partial lengths of the semiconductor laser.

The trenches 29, 73 may extend in the Y-direction, for example, to the level of the first waveguide 5. Preferably, the trenches 29, 73 may extend to the level of the active zone 6. In particular, the trenches 29 may extend as far as the second cladding layer 8, that is to say the n-type cladding layer.

Metals such as, for example, Cr, Ti, Pd, Pt, Rh, Ni, Al, Au etc. or combinations thereof may be used as absorbing materials for the absorbing layer 23 of each of the exemplary embodiments. Furthermore, semiconductor materials such as, for example, silicon, germanium, but also compound semiconductors such as, for example, gallium arsenide, aluminum gallium arsenide, gallium phosphide, aluminum nitride, silicon carbide, gallium nitride or gallium indium nitride or combinations thereof may be used as absorbing materials. The material compositions and dopings may be chosen such that a shunt of the pn junction, that is to say an electrically conductive connection between the p-side and n-side of the side faces, is avoided. Otherwise, an electrical insulation layer 24 may be provided between the semiconductor layers and the absorbing layer 23.

Furthermore, dielectric materials such as, for example, silicon dioxide, silicon oxynitride, silicon nitride, aluminum oxide, hafnium oxide, titanium oxide, tantalum oxide or zirconium oxide may also be used as absorbing materials for the absorbing layer 23. Moreover, it is possible to achieve an absorbing effect with regard to the electromagnetic radiation 21 or an increase in the absorbing effect by means of a targeted incorporation of impurity atoms or by means of a corresponding stoichiometric composition. By way of example, the absorbing effect of the layer 23 may be achieved by means of an increased proportion of compounds not saturated with oxygen, in particular of silicon atoms. Moreover, in particular in the case of a CVD deposition of the layer 23, an increased absorption effect for the electromagnetic radiation 23 may be achieved by means of a targeted surplus of hydrogen atoms.

Furthermore, hydrocarbons such as, for example, aromatics, parylene A, parylene B, parylene F, etc. or silicates may also be used as absorbing materials for the absorbing layer 23.

In the embodiment of the semiconductor laser comprising a gain-guided laser mode, the recesses 29 in accordance with FIGS. 12 to 20 might extend as far as a top side of the first semiconductor layer 3.

Figure 21:
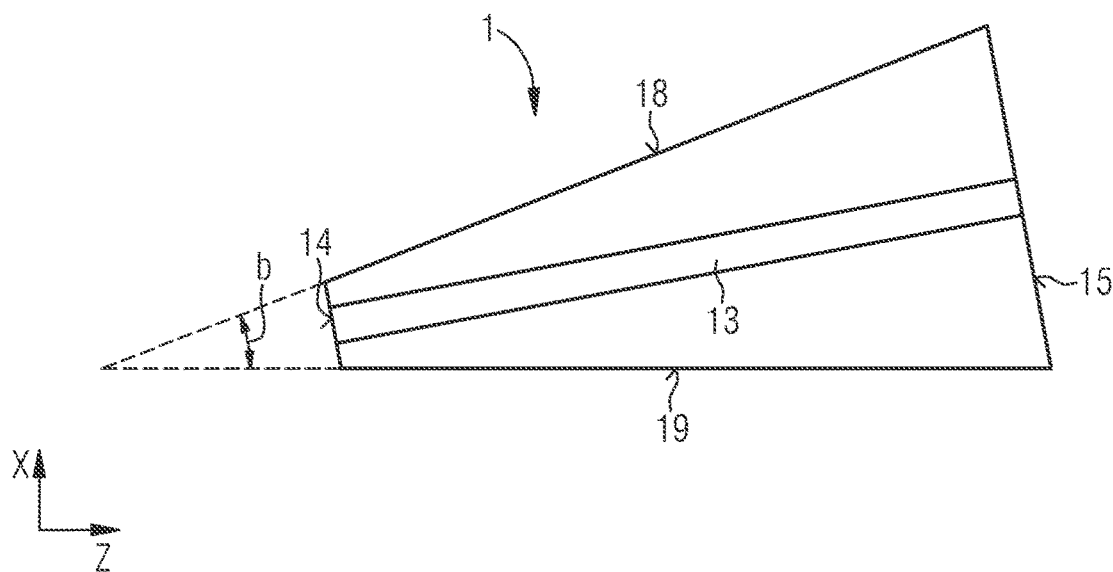
FIG. 21 illustrates a schematic illustration of a semiconductor laser comprising non-parallel side faces.

FIG. 21, in a schematic illustration, shows a view from above of a further embodiment of a semiconductor laser 1, wherein the ridge 13 is illustrated schematically. The semiconductor laser 1 is constructed, e.g., in accordance with FIG. 1. In this embodiment, the first and second side faces 18, 19 are not arranged parallel to one another. As viewed in an X-Z-plane, the first side face 18 and the second side face 19 are not arranged parallel to a longitudinal extent of the ridge 13, i.e., are not arranged parallel to the Z-direction. As viewed in the Z-X-plane, the first side face 18 and the second side face 19 are arranged in a manner inclined at a predefined angle of less than 90°, in particular less than 45°, with respect to the Z-direction. By way of example, the first side face 18 and the second side face 19 may be arranged in a range of 1° to 20°, in particular 10°, with respect to the Z-direction. Depending on the embodiment chosen, it is also possible for only one of the two side faces 18, 19 to be arranged in an inclined manner with respect to the Z-direction as viewed in the Z-X-plane. Furthermore, depending on the embodiment chosen, the first side face 18 and/or the second side face 19, in addition to the non-parallel arrangement with respect to the Z-direction, as viewed in a Y-X-plane, may be arranged parallel to the Y-axis, as was explained with reference to FIGS. 12 to 20.

Furthermore, depending on the embodiment chosen, the first side face 18 and/or the second side face 19, in addition to the non-parallel arrangement with respect to the Z-direction, as viewed in a Y-X-plane, may be arranged in a manner inclined at an angle with respect to the Y-axis, as was explained in FIGS. 2 to 11.

The first and second side faces may be arranged in each case in a Y-X-plane and, as viewed in an X-Z-plane, form a shallow second angle b in a range of 1° to 20°, in particular 10°. This already hinders the formation of a secondary mode, since there is no symmetry for a corresponding reflection of the electromagnetic radiation for forming a resonator, in particular a ring resonator. Depending on the embodiment chosen, at least one of the side faces 18, 19 may additionally also be arranged in a manner inclined at an angle with respect to the Y-direction, as explained with reference to FIGS. 2 to 11.

Figure 22:
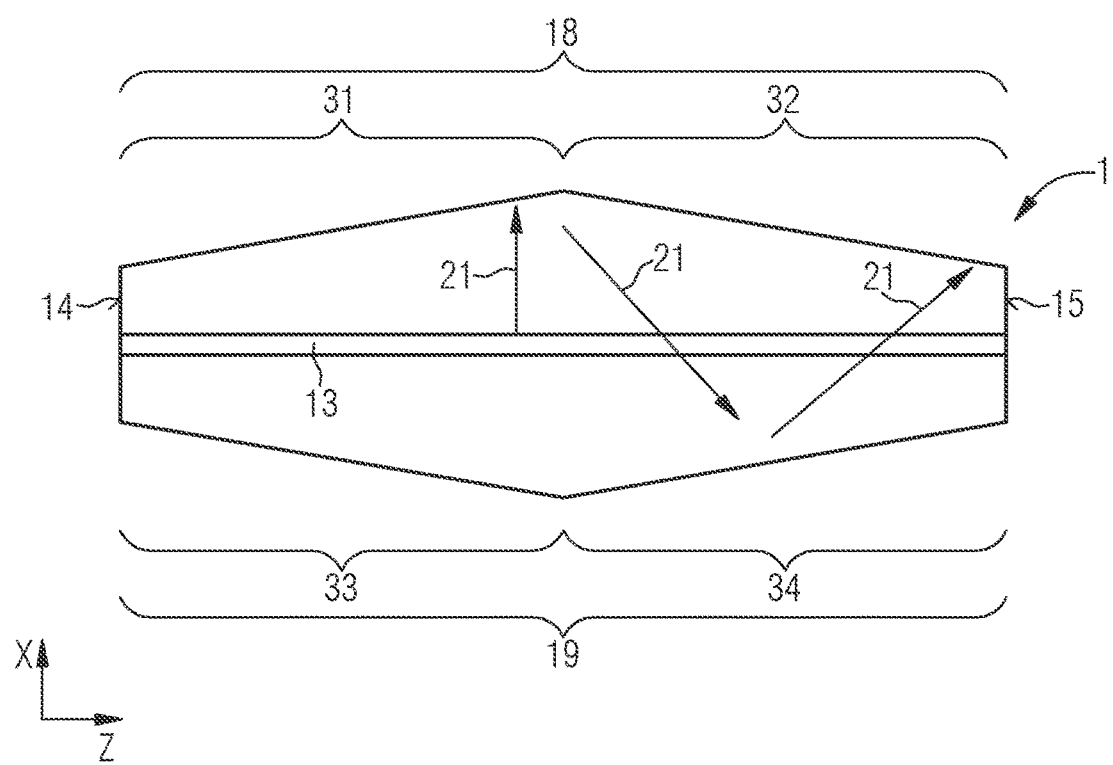
FIG. 22 illustrates a schematic illustration of a further semiconductor laser comprising side faces comprising partial sections arranged in an inclined manner.

FIG. 22 shows a further embodiment of a semiconductor laser 1 from above. The semiconductor laser 1 is constructed substantially in accordance with FIG. 1. In this embodiment, the first side face 18 is subdivided into a first partial side face 31 and a second partial side face 32. Moreover, the second side face 19 is also subdivided into a third and a fourth partial side face 33, 34. Depending on the embodiment chosen, only one side face 18, 19 is subdivided into partial side faces. The first partial side face 31 extends from the first end face 14 as far as the center of the semiconductor laser 1. The second partial side face 32 extends from the center of the semiconductor laser 1 as far as the second end face 15. The third partial side face 33 extends from the first end face 14 right into the center of the semiconductor laser 1. The fourth partial side face 34 extends from the center of the semiconductor laser 1 as far as the second end face 15. The first and third partial side faces 31, 33 are not arranged parallel to one another. Likewise, the second and fourth partial side faces 32, 34 are not arranged parallel to one another.

As viewed in an X-Z-plane, the partial side faces 31, 32, 33, 34 are not arranged parallel to a longitudinal extent of the ridge 13, i.e., are not arranged parallel to the Z-direction. As viewed in the Z-X-plane, the partial side faces 31, 32, 33, 34 are arranged in a manner inclined at a predefined angle of less than 90°, in particular less than 45°, with respect to the Z-direction. By way of example, partial side faces 31, 32, 33, 34 may be arranged in a range of 1° to 20°, in particular 10°, with respect to the Z-direction. Depending on the embodiment chosen, it is also possible for only one of the partial side faces 31, 32, 33, 34 to be arranged in an inclined manner with respect to the Z-direction as viewed in the Z-X-plane. Furthermore, depending on the embodiment chosen, at least one of the partial side faces 31, 32, 33, 34, in addition to the non-parallel arrangement with respect to the Z-direction, as viewed in a Y-X-plane, may be arranged parallel to the Y-axis, as was explained with reference to FIGS. 12 to 20.

Furthermore, depending on the embodiment chosen, at least one of the partial side faces 31, 32, 33, 34, in addition to the non-parallel arrangement with respect to the Z-direction, as viewed in a Y-X-plane, may be arranged in a manner inclined at an angle with respect to the Y-axis, as was explained in FIGS. 2 to 11.

A build-up of oscillation of a secondary mode of an electromagnetic radiation is hindered or prevented on account of the non-parallel arrangement of the partial side faces.

In the example illustrated, the semiconductor laser 1 is embodied such that it is wider in the X-direction in the center than in the region of the end faces 14, 15. Depending on the embodiment chosen, the semiconductor laser 1 may also be formed such that it is narrower in the X-direction in the center than in the end faces. Moreover, the first and second partial side faces may comprise different lengths in comparison with the third and fourth partial side faces 33, 34. Consequently, any arrangement of partial side faces or of side faces which are arranged opposite in a manner not parallel to one another may be used to hinder or to prevent the build-up of oscillation of secondary modes of the electromagnetic radiation 21 in the semiconductor laser 1.

The embodiments in FIGS. 21 and 22 may be formed as antireflective at the first and/or at the second side face 18, 19 at least in a partial region of the first and/or of the second side face in accordance with the embodiment in FIG. 17, wherein the antireflective partial region transmits more than 50%, in particular more than 80% or more than 90%, of the electromagnetic radiation emitted by the active zone. The reflection back into the mode space is greatly reduced as a result. Depending on the embodiment chosen, in each case the entire first and/or second side face 18, 19 may be antireflective and comprise, for example, an antireflective layer.

Moreover, in a further embodiment, an antireflective layer in accordance with the example in FIG. 17 may be applied in an upper section of the first side face 18 and/or of the second side face 19. The upper section extends in the Y-direction at least right into the first waveguide layer or in particular to beyond the second waveguide layer, in particular to beyond the second cladding layer. The antireflective layer may extend over the entire length of the first and/or of the second side face 18, 19 in the Z-direction. Moreover, depending on the embodiment chosen, the antireflective layer may also be formed only in sections along the length of the semiconductor laser, i.e., along the Z-direction, on the first and/or the second side face 18, 19.

In an analogous manner, the partial side faces 31, 32, 33, 34 in FIG. 22 are also at least partly antireflective and, for example, at least partly provided with an antireflective layer.

Dielectric layers such as, for example, silicon oxide, aluminum oxide, titanium oxide, zirconium oxide, tantalum oxide, etc. or combinations thereof or layer stacks comprising at least one of said materials may be used for the formation of the antireflective layer. A reflection of an electromagnetic radiation at the first and/or the second side face 18, 19 may be reduced with the aid of the antireflective layer.

Figure 23:
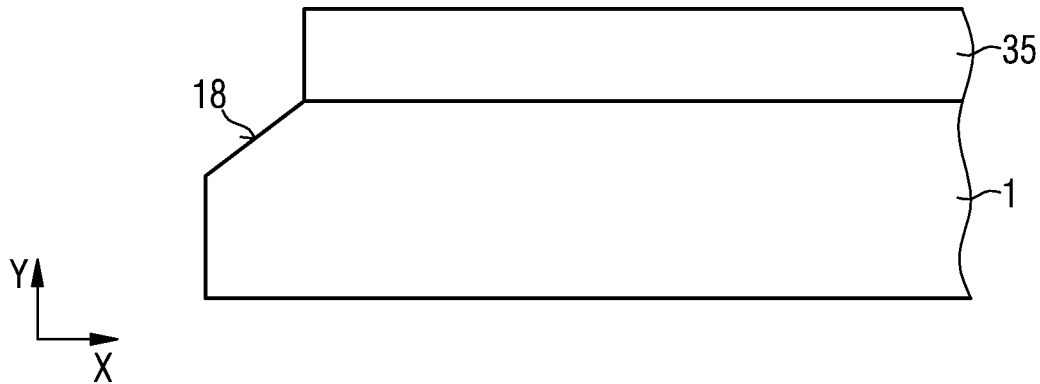
FIGS. 23 to 25 illustrate method steps for producing a chamfered semiconductor sidewall.
Figure 24:
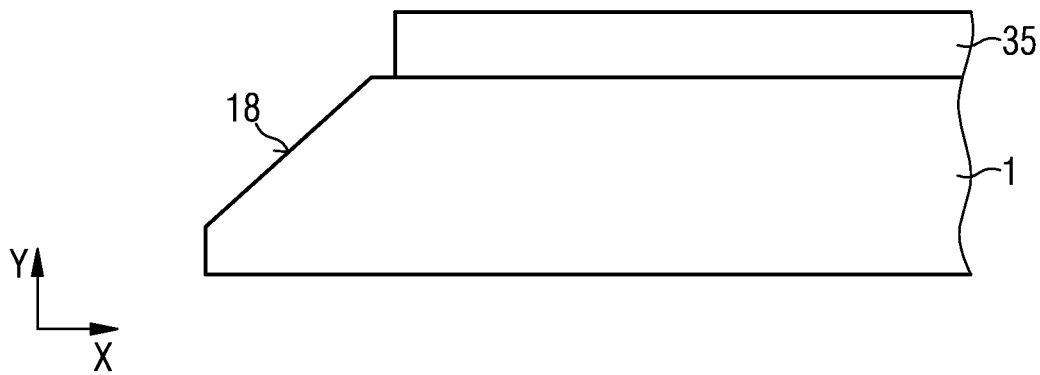
Figure 25:
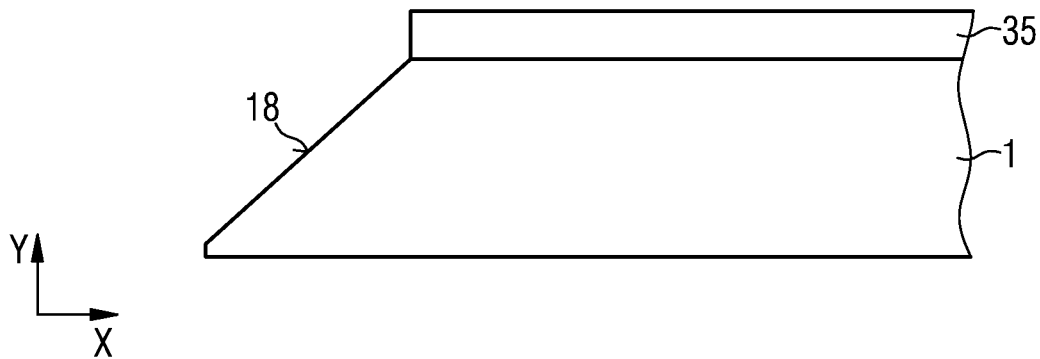

FIGS. 23 to 25 show various method steps for a method for introducing inclined side faces into a semiconductor layer structure. FIG. 23 shows in a schematic illustration a first method step, in which an inclined side face 18 may be produced at a semiconductor laser 1 with the aid of an etching mask 35 with the aid of a dry-chemical method. The etching mask 35 comprises only a limited resistance vis-à-vis the etching gases. As a result of the attack of the etching gases from above and simultaneously from the side, the etching mask recedes both in the X-direction and in the Y-direction during the etching process. This may be discerned with reference to FIG. 24, which shows the etching mask 35 and the semiconductor laser 1 after a predefined etching time. The etching mask is thinner in the Y-direction and has been etched back in the X-direction.

By means of further etching, the side face 18 is etched into the semiconductor laser 1 for a longer time, as is discernible with reference to FIG. 25. Once the desired inclination of the first side face 18 has been attained, the dry-chemical etching process may be ended and the etching mask 35 may subsequently be removed.

The etching mask 35 may consist of photoresist, for example. Moreover, a stable etching mask 35 comprising, for example, silicon oxide, silicon nitride, aluminum oxide, titanium oxide, tantalum oxide etc. or a metal such as, for example, titanium, palladium, gold, silver or combinations thereof may be used. This method may be used in particular for gallium nitride and aluminum gallium indium nitride material systems.

Figure 26:
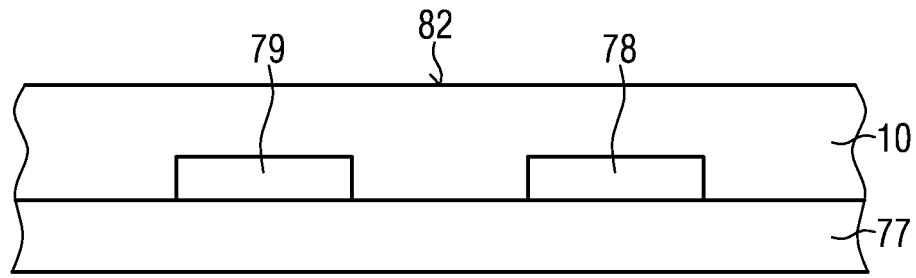
FIG. 26 illustrates a partial cross section through a substrate and a carrier.

FIG. 26 shows a substrate 10 in a schematic partial cross section, which substrate is arranged on a carrier 77 for a deposition process for semiconductor layers, in particular for semiconductor layers to be deposited epitaxially. The substrate 10 comprises recesses 78, 79 at the underside. Consequently, the substrate does not bear on the carrier 77 in the region of the recesses. As a consequence thereof, the temperatures established on the surface 82 of the substrate 10 above the recesses 78, 79 are higher than those in adjacent regions. These temperature differences may be used to produce laterally different compositions in a layer and thus to form laterally delimited absorbing regions in the layer.

Figure 27:
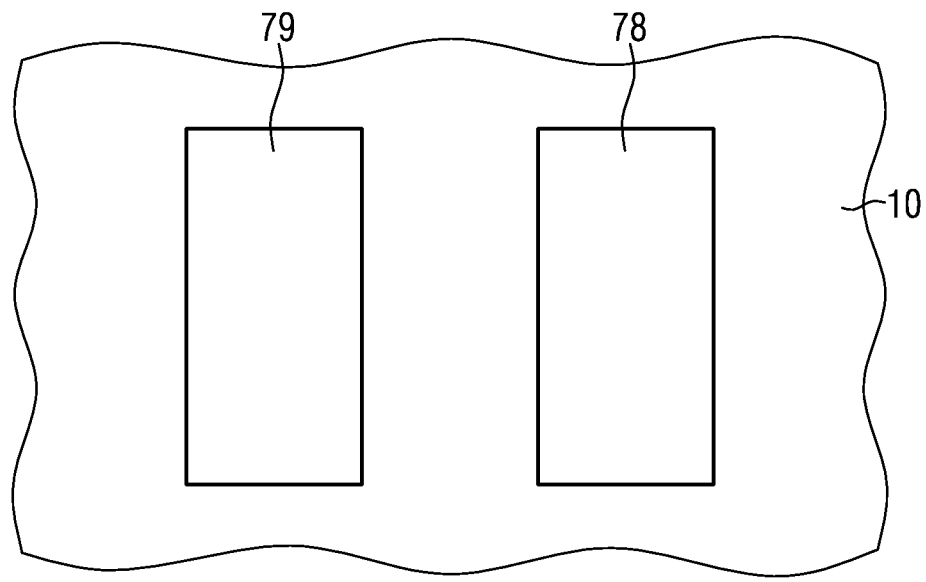
FIG. 27 illustrates a view of an underside of a substrate.

FIG. 27 shows an excerpt from the substrate 10 with a view of the underside with the recesses 78, 79.

Figure 28:
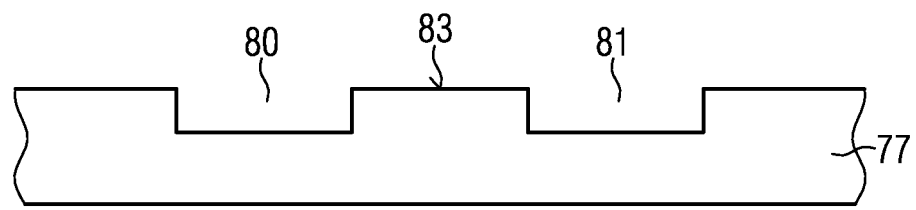
FIG. 28 illustrates a partial cross section through a further carrier with recesses.

Depending on the embodiment chosen, instead of the substrate, the carrier 77 may also comprise further recesses 80, 81 on a top side 83, on which the substrate bears during the deposition of the semiconductor layers. FIG. 28 shows a schematic partial cross section through the carrier 77.

With the aid of the exemplary embodiments described, a high-power semiconductor laser may be provided, wherein the formation of secondary modes outside the mode space is hindered or prevented.

The invention has been illustrated in greater detail on the basis of the preferred exemplary embodiments and described for semiconductor lasers comprising a ridge structure and index guiding. Nevertheless, the invention is not restricted to the examples disclosed. The invention may however likewise be used in the case of gain-guided semiconductor lasers. Rather, other variations may be derived therefrom by the person skilled in the art, without departing from the scope of protection of the invention.

The invention claimed is:

1. A semiconductor laser comprising:
   a layer structure comprising an active zone configured to generate an electromagnetic radiation,
   wherein the layer structure comprises a sequence of layers,
   wherein two opposite end faces are provided in a Z-direction,
   wherein at least one first end face is configured to at least partly couple out the electromagnetic radiation,
   wherein a second end face is configured to at least partly reflect the electromagnetic radiation,
   wherein the layer structure is configured to provide a mode space between the two end faces, the mode space configured to form an optical mode,
   wherein the sequence of layers is implemented along a Y-direction,
   wherein the active zone is arranged in an X-Z-plane,
   wherein the layer structure comprises at least one first side face,
   wherein the at least one first side face extends along the Z-direction,
   wherein the at least one first side face is inclined within the X-Z-plane at an angle with respect to the Z-direction having a first inclination,
   wherein the layer structure with the at least one first side face with the first inclination is configured to hinder a formation of an optical mode outside the mode space, wherein the at least one first side face is inclined within an Y-X-plane at an angle with respect to the Y-direction having a second inclination, and wherein the layer structure with the at least one first side face with the second inclination is configured to hinder the formation of the optical mode outside the mode space.

2. The semiconductor layer laser according to claim 1, wherein the semiconductor laser is configured to hinder the formation of modes with a propagation direction that do not extend perpendicularly to the end faces.

3. The semiconductor laser according to claim 1, wherein the layer structure comprises at least one second side face, wherein the second side face extends along the Z-direction, wherein the second side face is inclined within the X-Z-plane at an angle with respect to the Z-direction having a third inclination, wherein the second side face is arranged opposite the first side face, and wherein the layer structure with the at least one second side face with the third inclination is configured to hinder the formation of the optical mode outside the mode space.

4. The semiconductor laser according to claim 1, wherein the first side face comprises at least one antireflective partial region, and wherein the antireflective partial region is configured to transmit more than 50% of the electromagnetic radiation emitted by the active zone.

5. The semiconductor laser according to claim 1, a deflector is provided at at least one partial region of the first side face, wherein the deflector is configured to bring about a reflection of the electromagnetic radiation that emanates from the mode space and impinges on the first side face in a direction alongside the mode space.

6. The semiconductor laser according to claim 5, wherein the first side face is arranged in a manner inclined at an angle with respect to a plane of the active zone, and wherein the angle lies a range of between 1° and 89° relative to the plane of the active zone.

7. The semiconductor laser according to claim 5, wherein the first side face extends along the Y-direction right into a plane of a first waveguide layer, wherein the first side face extends along the Y-direction right into a plane of a second waveguide layer, and wherein the second waveguide layer is arranged below the active zone.

8. The semiconductor laser according to claim 5, wherein at least one partial region of the first side face comprises a mechanical structure that is configured to reduce or prevent reflection or propagation of the electromagnetic radiation, and wherein the mechanical structure comprises a roughness in form of steps and/or in form of dislocations.

9. The semiconductor laser according to claim 1, further comprising an absorbing layer outside the mode space, wherein the absorbing layer is configured to damp the electromagnetic radiation.

10. The semiconductor laser according to claim 9, wherein the layer structure comprises a trench, wherein the trench comprises a predefined depth in the Y-direction, a predefined width in an X-direction and a predefined length in the Z-direction, wherein the trench extends at least over part of a length of the semiconductor laser in the Z-direction, wherein the trench is at least partly provided with the absorbing layer, and wherein the absorbing layer is configured to at least partly absorb the electromagnetic radiation.

11. The semiconductor laser according to claim 9, wherein the absorbing layer comprises a metal and/or a semiconductor material.

12. The semiconductor laser according to claim 9, wherein the absorbing layer comprises a compound semiconductor and/or a dielectric material and/or hydrocarbons.

13. A semiconductor laser comprising:
a layer structure comprising an active zone configured to generate an electromagnetic radiation,
wherein the layer structure comprises a sequence of layers,
wherein two opposite end faces are provided in a Z-direction,
wherein at least one end face is configured to at least partly couple out the electromagnetic radiation,
wherein a second end face is configured to at least partly reflect the electromagnetic radiation,
wherein the layer structure is configured to provide a mode space between the two end faces, the mode space configured to form an optical mode,
wherein the layer structure is configured to hinder a formation of an optical mode outside the mode space; and
an absorbing layer outside the mode space,
wherein the absorbing layer is configured to damp the electromagnetic radiation,
wherein the absorbing layer comprises at least an absorbing partial region of at least one layer of the layer structure,
wherein the absorbing partial region of the layer is formed vis-à-vis another region of the layer such that the partial region is configured to absorb or scatter the electromagnetic radiation better than the other region of the layer, and
wherein the absorbing layer is arranged outside the active zone.

14. The semiconductor laser according to claim 13, wherein at least the absorbing partial region comprises impurity atoms and/or an increased concentration of dopants and/or a changed composition of a semiconductor material, and/or wherein the absorbing layer comprises quantum films, wherein the quantum films comprise a smaller band gap in the absorbing partial region than in the other region, wherein the smaller band gap is produced in particular by a larger thickness of the quantum film and/or by a different composition, such that the electromagnetic radiation is absorbed better than in other regions of the active zone.

15. A semiconductor laser comprising:
a layer structure comprising an active zone configured to generate an electromagnetic radiation,
wherein the layer structure comprises a sequence of layers,
wherein two opposite end faces are provided in a Z direction,
wherein at least one first end face is configured to at least partly couple out the electromagnetic radiation,
wherein a second end face is configured to at least partly reflect the electromagnetic radiation,
wherein the layer structure is configured to provide a mode space between the two end faces, the mode space configured to form an optical mode, and
wherein the semiconductor laser or the layer structure is configured to hinder a formation of the optical mode outside the mode space; and
an absorbing layer outside the mode space,
wherein the absorbing layer is configured to damp the electromagnetic radiation,
wherein an electrical barrier layer located between the absorbing layer and at least one layer of the layer structure is configured to reduce or prevent an undesired current flow between two layers of the layer structure and/or wherein the absorbing layer is formed in form of at least one absorbing partial region of the layer structure,
wherein the at least one absorbing partial region is arranged outside the mode space, and
wherein the at least one absorbing partial region is configured to at least partly absorb the electromagnetic radiation.

16. A semiconductor laser comprising:
a layer structure comprising an active zone configured to generate an electromagnetic radiation,
wherein the layer structure comprises a sequence of layers,
wherein two opposite end faces are provided in a Z direction,
wherein at least one first end face is configured to at least partly couple out the electromagnetic radiation,
wherein a second end face is configured to at least partly reflect the electromagnetic radiation,
wherein the layer structure is configured to provide a mode space between the two end faces, the mode space configured to form an optical mode,
wherein the layer structure is configured to hinder a formation of the optical mode outside the mode space,
wherein the layer structure comprises at least one first side face,
wherein the first side face within an X-Z-plane is arranged in a manner inclined with a constant angle with respect to the Z-direction extending from the first end face to the second end face,
wherein the layer structure comprises a second side face, the second side face being arranged opposite to the first side face with respect to a longitudinal middle axis of the semiconductor laser,
wherein the second side face extends along the Z-direction,
wherein the second side face is inclined within the X-Z-plane at an angle with respect to the Z-direction, and
wherein the first side face and the second side face are arranged mirror symmetrical with respect to the longitudinal middle axis.

17. A semiconductor laser comprising:
a layer structure comprising an active zone configured to generate an electromagnetic radiation,
wherein the layer structure comprises a sequence of layers,
wherein two opposite end faces are provided in a Z direction,
wherein at least one first end face is configured to at least partly couple out the electromagnetic radiation,
wherein a second end face is configured to at least partly reflect the electromagnetic radiation,
wherein the layer structure is configured to provide a mode space between the two end faces, the mode space configured to form an optical mode,
wherein the semiconductor laser or the layer structure is configured to hinder a formation of the optical mode outside the mode space,
wherein the layer structure comprises at least one first side face,
wherein the layer structure comprises at least one second side face,
wherein the second side face extends along the Z-direction,
wherein the first side face is subdivided into a first partial side face and a second partial side face,
wherein the second side face is subdivided into a third partial side face and a fourth partial side face,
wherein the first partial side face extends from the first end face as far as a center of the semiconductor laser,
wherein the second partial side face extends from the center of the semiconductor laser as far as the second end face,
wherein the third partial side face extends from the first end face right into the center of the semiconductor laser,
wherein the fourth partial side face extends from the center of the semiconductor laser as far as the second end face,
wherein the first and third partial side faces are not arranged parallel to one another,
wherein the second and fourth partial side faces are not arranged parallel to one another, and
wherein the semiconductor laser is embodied such that it is wider in an X direction in the center than in regions of the end faces or wherein the semiconductor laser is embodied such that it is narrower in the X direction in the center than in the end faces.

* * * * *

UNITED STATES PATENT AND TRADEMARK OFFICE
CERTIFICATE OF CORRECTION

PATENT NO. : 11,201,454 B2
APPLICATION NO. : 16/091172
DATED : December 14, 2021
INVENTOR(S) : Clemens Vierheilig et al.

Page 1 of 1

It is certified that error appears in the above-identified patent and that said Letters Patent is hereby corrected as shown below:

In the Claims

Claim 2, Column 23, Line 8; delete "semiconductor layer laser according" and insert --semiconductor laser according--.

Claim 5, Column 23, Line 27-28; delete "claim 1, a deflector" and insert --claim 1, wherein a deflector--.

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*